US007215938B2

(12) United States Patent
Asayama et al.

(10) Patent No.: US 7,215,938 B2
(45) Date of Patent: May 8, 2007

(54) RADIO-FREQUENCY RECEIVER AND INTEGRATED CIRCUIT FOR USE IN RECEIVER

(75) Inventors: Sanae Asayama, Nagoya (JP); Koji Nakatsuji, Gifu (JP); Masanori Suzuki, Ichinomiya (JP); Atsuhito Terao, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 211 days.

(21) Appl. No.: 10/962,850

(22) Filed: Oct. 12, 2004

(65) Prior Publication Data

US 2005/0079839 A1    Apr. 14, 2005

(30) Foreign Application Priority Data

Oct. 14, 2003    (JP) .............................. 2003-353454

(51) Int. Cl.
| H04B 1/18 | (2006.01) |
| H04B 7/00 | (2006.01) |
| H04B 1/28 | (2006.01) |

(52) U.S. Cl. ..................... 455/260; 455/183.1; 455/333
(58) Field of Classification Search ................ 455/260, 455/180.1, 180.3, 179.1, 188.1, 190.1, 255, 455/333, 182.1; 348/725, 731, 729, 732, 348/733

See application file for complete search history.

(56) References Cited

U.S. PATENT DOCUMENTS

| 6,108,050 | A * | 8/2000 | Yamamoto et al. ......... 348/731 |
| 6,177,964 | B1 * | 1/2001 | Birleson et al. ............ 348/725 |
| 6,483,552 | B1 * | 11/2002 | Yamamoto .................. 348/729 |
| 6,573,949 | B1 * | 6/2003 | Yamamoto .................. 348/731 |
| 6,724,440 | B1 * | 4/2004 | Suan et al. .................. 348/731 |
| 6,842,198 | B2 * | 1/2005 | Suzuki et al. ............... 348/731 |
| 7,002,639 | B2 * | 2/2006 | Kawai ......................... 348/731 |
| 7,120,413 | B2 * | 10/2006 | Lee et al. .................... 455/260 |
| 2005/0032492 | A1 * | 2/2005 | Asayama et al. ......... 455/150.1 |
| 2006/0046678 | A1 * | 3/2006 | Noda et al. ................. 455/285 |

FOREIGN PATENT DOCUMENTS

JP    01-265688 A    10/1989

(Continued)

OTHER PUBLICATIONS

European Search Report for EP 04 02 4078, dated Feb. 15, 2005.

*Primary Examiner*—Sonny Trinh
(74) *Attorney, Agent, or Firm*—RatnerPrestia

(57) ABSTRACT

A radio-frequency (RF) receiver includes an input terminal for receiving RF signals in a first frequency band and a second frequency band lower than the first frequency band, a first tuned filter allowing a signal of a passing frequency in the RF signal in the first frequency band to pass through the filter, a local oscillator, a frequency divider for frequency-dividing a signal output from the local oscillator, a first mixer operable to convert the signal output from the first tuned filter into a signal of an intermediate frequency, a second tuned filter allowing a signal of a passing frequency of the RF signal in the second frequency band to pass through the filter, a second mixer operable to convert the signal output from the second tuned filter into a signal of the intermediate frequency, and a phase-locked-loop (PLL) circuit operable to control an oscillation frequency of the local oscillator and the passing frequencies of the first tuned filter and the second tuned filter.

30 Claims, 12 Drawing Sheets

FOREIGN PATENT DOCUMENTS

| | | |
|---|---|---|
| JP | 2000-223956 | 8/2000 |
| JP | 2000-295539 A | 10/2000 |
| JP | 2002-111526 | 4/2002 |
| JP | 2002-118795 A | 4/2002 |
| JP | 2004-179841 | 6/2004 |
| WO | WO 01/20792 | 3/2001 |

* cited by examiner

RADIO-FREQUENCY RECEIVER AND INTEGRATED CIRCUIT FOR USE IN RECEIVER

FIELD OF THE INVENTION

The present invention relates to a radio-frequency receiver, such as a television tuner, and an integrated circuit for use in the radio-frequency receiver.

BACKGROUND OF THE INVENTION

FIG. 12 is a block diagram of a conventional radio-frequency (RF) receiver. An RF signal having a frequency ranging from 55.25 MHz to 801.25 MHz is input to an input terminal 1. A single-tuned filter 2 is implemented by a signal variable capacitance diode and receives the RF signal input to the input terminal 1. The single-tuned filter 2 has a tuning frequency varying within a UHF band (367.25 MHz to 801.25 MHz) in response to a tuning voltage input to a frequency variable port 2a.

An RF amplifier 3 amplifies a signal of the UHF band output from the single-tuned filter 2. An output of the RF amplifier 3 is connected to a double-tuned filter 4 composed of two variable capacitance diodes and having a tuning frequency varying in response to a tuning voltage supplied to a frequency variable port 4a.

A signal output from the double-tuned filter 4 is supplied to one input port of a mixer 5. The other input port of the mixer 5 receives a signal output from a local oscillator 6 via a frequency divider 7. The mixer 5 mixes the UHF signal from the double-tuned filter 4 with an oscillation signal from the local oscillator 6 to convert the signal output from the double-tuned filter 4 into an intermediate-frequency signal at 45.75 MHz. An intermediate-frequency filter 8 is connected to an output port of the mixer 5 to attenuate undesired components of a signal outside of its range of 6 MHz. A signal output from the intermediate-frequency filter 8 is then amplified by an intermediate-frequency amplifier and output from an output terminal 9.

The single-tuned filter 2, the RF amplifier 3, the double-tuned filter 4, the mixer 5, and the intermediate-frequency filter 8 constitute an UHF signal receiver section 10.

A VHF signal receiver section 11 receives signals of a VHF band from 55.25 MHz to 361.25 MHz through the input terminal 1, and composed of a single-tuned filter 12, an RF amplifier 13, a double-tuned filter 14, and a mixer 15.

The single tuned filter 12 is composed of a single variable capacitance diode and has a tuning frequency varying in response to a tuning voltage supplied to a frequency variable port 12a. The RF amplifier 13 amplifies a signal at the VHF band output from the single-tuned filter 12.

The double-tuned filter 14 is connected to an output port of the RF amplifier 13 and composed of two variable capacitance diodes and has a tuning frequency varying in response to a tuning voltage supplied to a frequency variable port 14a. The mixer 15 has one input port receiving a signal output from the double-tuned filter 14 and has the other input port receiving a signal output from the local oscillator 6 via a frequency divider 16. The mixer 15 mixes the VHF signal passing through the double-tuned filter 14 with the oscillation signal from the local oscillator 6 to convert the VHF signal from the double-tuned filter 14 into an intermediate-frequency signal at 45.75 MHz. A signal output from the mixer 15 is transmitted to an input port of the intermediate-frequency filter 8.

A tuning section 18 is connected between input ports 17a and 17b of an oscillator 17. The tuning section 18 includes a series assembly 21 including a variable capacitance diode 19 and a capacitor 20 connected in series with each other and an inductor 22 connected in parallel with the series assembly 21.

The output port of the oscillator 17 is connected to an input port of a phase-locked-loop (PLL) circuit 23. The PLL circuit 23 supplies tuning voltages from an output port 23a to the variable capacitance diode 19 in the tuning section 18 and variable capacitance diodes in the single-tuned filter 2, the double-tuned filter 4, the single-tuned filter 12, and the double-tuned filter 14 for controlling the oscillation frequency of the local oscillator 6 and the tuning frequencies of the single-tuned filter 2, the double-tuned filter 4, the single-tuned filter 12, and the double-tuned filter 14.

In the conventional receiver, the mixers 5 and 15 output intermediate-frequency signals at 45.75 MHz. This requires frequencies of signals passing through the single-tuned filters 2 and 12 and the double-tuned filters 4 and 14 to be separated by the range of the intermediate-frequency (45.75 MHz) from the frequencies of the signals output from the frequency dividers 7 and 16.

Such conventional receiver receives a wide frequency range from the VHF band to the UHF band with the single local oscillator 6. It is hence not easy to separate the frequencies of signals passing through the single-tuned filters 2 and 12 and the double-tuned filters 4 and 14 by the range of the intermediate frequency from the frequency of the signals output from the frequency dividers 7 and 16. Accordingly, the passing frequencies of the tuned filters may shift from a receiving channel, hence reducing attenuation of any interference signal. As a result, an interference signal may be received directly by the mixers 5 and 15, hence causing image interruption.

Conventional RF receivers similar to the receiver explained above are disclosed in Japanese Patent Laid-Open Publication Nos.2000-295539, 2002-118795, and 1-265688.

SUMMARY OF THE INVENTION

A radio-frequency (RF) receiver includes an input terminal for receiving RF signals in a first frequency band and a second frequency band lower than the first frequency band, a first tuned filter allowing a signal of a passing frequency in the RF signal in the first frequency band to pass through the filter, a local oscillator, a frequency divider for frequency-dividing a signal output from the local oscillator, a first mixer operable to convert the signal output from the first tuned filter into a signal of an intermediate frequency, a second tuned filter allowing a signal of a passing frequency of the RF signal in the second frequency band to pass through the filter, a second mixer operable to convert the signal output from the second tuned filter into a signal of the intermediate frequency, and a phase-locked-loop (PLL) circuit operable to control an oscillation frequency of the local oscillator and the passing frequencies of the first tuned filter and the second tuned filter. The signal output from the frequency divider contains a first output signal and a second output signal different in phase by 90 degrees from the first output signal. The second mixer includes a third mixer operable to mix the signal output from the second tuned filter with the first output signal of the frequency divider, a first phase shifter operable to shift a signal output from the third mixer in phase by 90 degrees, and a fourth mixer operable to mix the signal output from the second tuned filter with the second output signal of the frequency divider. A signal output from the fourth mixer and a signal output from the first phase shifter are output from an output terminal.

The RF receiver reduces image interfering components of the second frequency band which may inevitably cause image interference since including an image-rejection mixer in the second frequency band.

DETAILED DESCRIPTION OF THE PREFERRED EMBODIMENTS (Exemplary Embodiment 1)

Figure 1:
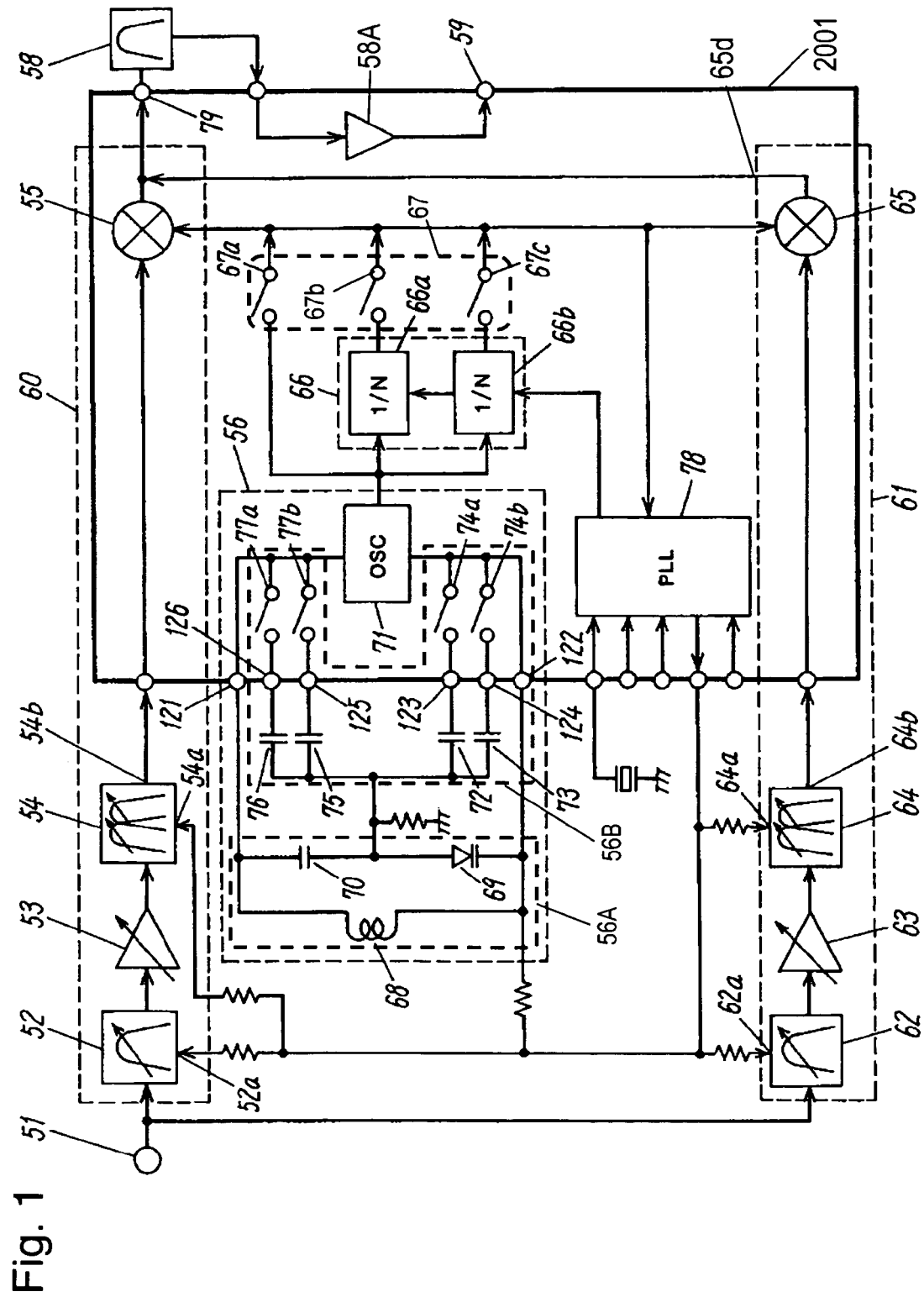
FIG. 1 is a block diagram of a radio-frequency (RF) receiver according to Exemplary Embodiment 1 of the present invention.

FIG. 1 is a block diagram of a radio-frequency (RF) receiver according to Exemplary Embodiment 1 of the present invention. An RF signal ranging from 55.25 MHz to 801.25 MHz is received at an input terminal 51. A single-tuned filter 52 is connected to the input terminal 51 and implemented by a signal variable capacitance diode and has a tuning frequency variable within an UHF band from 367.25 MHz to 801.25 MHz in response to a tuning voltage supplied to a frequency variable port 52a.

An RF amplifier 53 amplifies a signal output of the UHF band output from the single-tuned filter 52. The radio-frequency amplifier 53 has an output port connected to a double-tuned filter 54 which is composed by two variable capacitance diodes and has a tuning frequency variable in response to a tuning voltage supplied to a frequency variable port 54a.

A mixer 55 has one input port for receiving a signal output from the double-tuned filter 54 and has other input port for receiving a signal output from a local oscillator 56. The mixer 55 mixes the UHF signal passing through the double-tuned filter 54 with an oscillation signal output from the local oscillator 56 to convert the signal output from the double-tuned filter 54 into an intermediate-frequency signal at 45.75 MHz. A signal output from the mixer 55 is supplied transferred via an output port 79 to an intermediate-frequency filter 58. The intermediate-frequency filter 58 attenuates undesired components in the signal outside of a range of 6 MHz. A signal output from the intermediate-frequency filter 58 is amplified by an intermediate-frequency amplifier 58A and supplied to an output terminal 59.

The single-tuned filter 52, the RF amplifier 53, the double-tuned filter 54, the mixer 55, and the intermediate-frequency filter 58 constitute a UHF signal receiver section 60.

A VHF signal receiver section 61 receives signals in a VHF band from 55.25 MHz to 361.25 MHz through the input terminal 51 and is composed of a single-tuned filter 62, an RF amplifier 63, a double-tuned filter 64, and a mixer 65 connected in this order.

The single-tuned filter 62 is composed of a single variable capacitance diode and has a tuning frequency variable in response to a tuning voltage supplied to a frequency variable port 62a. The RF amplifier 63 amplifies a signal in the VHF band output from the single-tuned filter 62.

The double-tuned filter 64 is connected to the output port of the RF amplifier 63 and composed of two variable capacitance diodes and has a tuning frequency variable in response to a tuning voltage supplied to a frequency variable port 64a.

The mixer 65 has one input port for receiving a signal output from the double-tuned filter 64 and has other input port for receiving a signal output from the local oscillator 56 via a frequency divider 66. The mixer 65 mixes the VHF signal passing through the double-tuned filter 64 with the oscillation signal output from the local oscillator 56 convert the VHF signal output from the double-tuned filter 64 into an intermediate-frequency signal (at 45.75 MHz). A signal output from the mixer 65 is then transmitted via the output port 79 to the intermediate-frequency filter 58.

The frequency divider 66 includes a frequency divider 66a used for receiving signals in a VHF low band and a frequency divider 66b used for receiving signals in a VHF high band. Switches 67a, 67b, and 67c switches signals output from the local oscillator 56 and the frequency dividers 66a and 66b to selectively supply the signals to the mixers 55 and 65.

The local oscillator 56 includes a tuning section 56A composed of a series assembly including a variable capacitance diode 69 and a capacitor 70 connected in series with each other and an inductor 68 connected in parallel with the series assembly, an oscillator section 71 connected to both end of the series connected assembly, and an oscillation frequency adjuster 56B connected in parallel with the tuning section 56A and having an output port connected to the oscillator section 71.

The oscillation frequency adjuster section 56B includes capacitors 72 and 73 which are connected in parallel with the variable capacitance diode 69, switches 74a and 74b connected to the capacitors 72 and 73, respectively, capacitors 75 and 76 connected in parallel with the capacitor 70, and switches 77b and 77a connected to the capacitors 75 and 76, respectively.

The capacitors 72 and 73 are switched with the switches 74a and 74b while the capacitors 75 and 76 are switched with the switches 77a and 77b.

More particularly, upon the switches 74 and 77 operating, a capacitance of the capacitor connected in series with the variable capacitance diode 69 and a capacitance of the capacitor connected in parallel with the variable capacitance diode 69 can be changed. Accordingly, a tuning frequency of the tuning section 56A and the oscillation frequency of the local oscillator 56 can be changed. That is, the switches 74 and 77 operate as a capacitance adjuster section to change capacitances of capacitors connected to tuning section 56A.

The inductor 68 is connected in series with a variable capacitance diode, hence increasing a frequency range of the oscillation signal.

The oscillation signal output from the local oscillator 56 is divided by the frequency dividers 66 and supplied to a phase-locked-loop (PLL) circuit 78. The PLL circuit 78 supplies tuning voltages to the variable capacitance diode 69 as well as variable capacitance diodes 82, 84, 86, 89, 96, 98, 102, and 107 (shown in FIG. 2 and FIG. 3) in the single-tuned filter 52, the double-tuned filter 54, the single-tuned filter 62, and the double-tuned filter 64.

Figure 2:
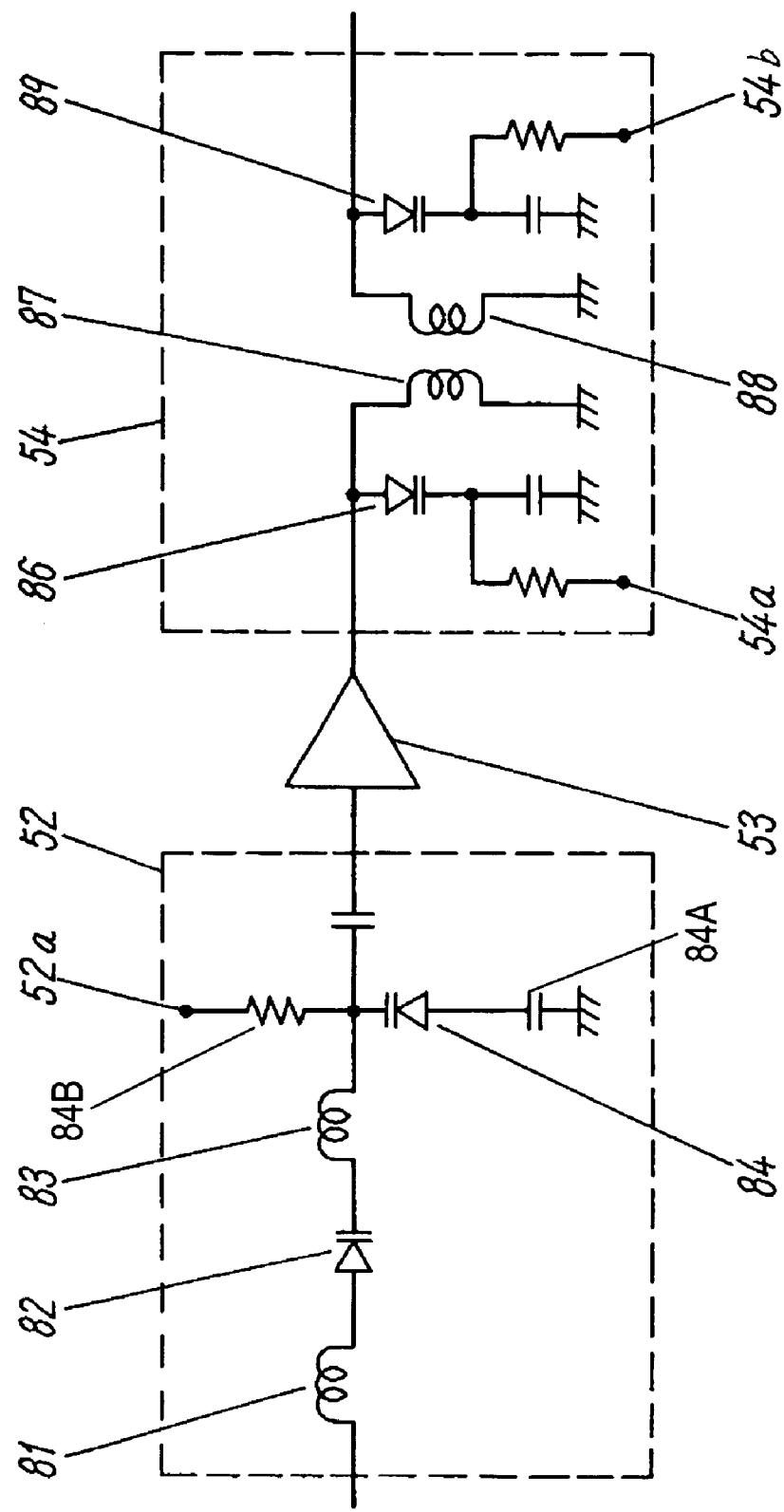
FIG. 2 is a circuit diagram of a tuned filter for receiving signals in a UHF band of the RF receiver according to Embodiment 1.

FIG. 2 is a circuit diagram of the single-tuned filter 52 and the double-tuned filter 54 in the UHF signal receiver section 60 according to Embodiment 1.

The variable capacitance diode 82 is connected in series with an inductor 81 and has a cathode connected to one end of an inductor 83. The other end of the inductor 83 is connected to a cathode of the variable capacitance diode 84. An anode of the variable capacitance diode 84 is coupled to a ground via a capacitor 84A. The frequency variable port 52a of the single tuned filter 52 is connected via a resistor 84B to the cathodes of the variable capacitance diodes 82 and 84, and receives the tuning voltage from the PLL circuit 78.

The single-tuned filter 52 is composed of the inductor 81, the variable capacitance diode 82, the inductor 83, and the variable capacitance diode 84. The single-tuned filter 52 has respective capacitances of the variable capacitance diodes 82 and 84 varying in response to the tuning voltage supplied to the frequency variable port 52a, thus determining the tuning frequency. In the single-tuned filter 52 of Embodiment 1, values of components are determined for allowing signals in the UHF band to pass through the filter.

The double-tuned filter 54 is composed of the variable capacitance diode 86, an inductor 87 connected in parallel with the variable capacitance diode 86, an inductor 88 inductively coupled to the inductor 87, and the variable capacitance diode 89 connected in parallel with the inductor 88. The frequency variable ports 54a and 54b of the double-tuned filter 54 are connected to cathodes of the variable capacitance diodes 86 and 89, respectively, for receiving the tuning voltage supplied from the PLL circuit 78.

In the double-tuned filter 54, capacitances of the variable capacitance diodes 86 and 89 change in response to the tuning voltage supplied to the frequency variable ports 54a and 54b, respectively, thus determining the tuning frequency.

Figure 3:
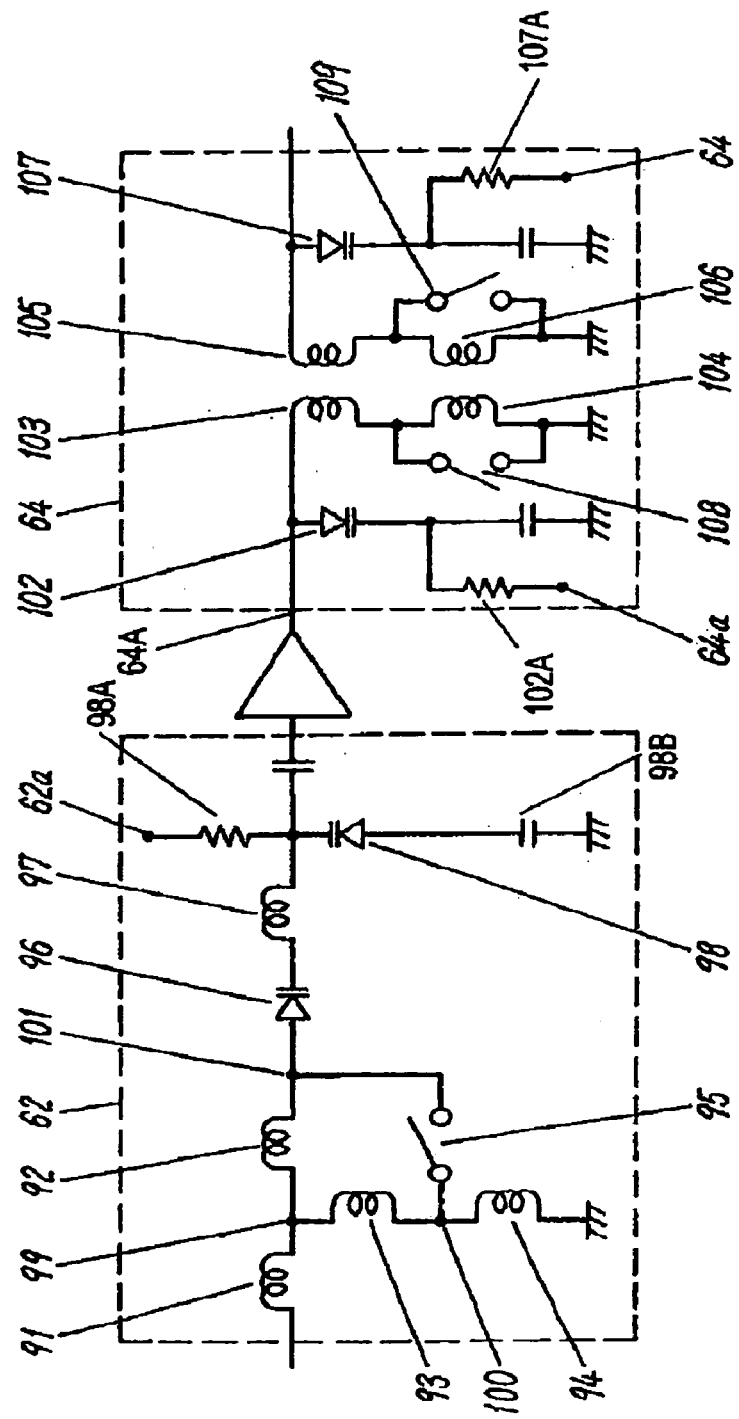
FIG. 3 is a circuit diagram of a tuned filter for receiving signal in a VHF band of the RF receiver according to Embodiment 1.

FIG. 3 is a circuit diagram of the single-tuned filter 62 and the double-tuned filter 64 in the VHF signal receiver section 61 of Embodiment 1.

The single-tuned filter 62 is composed of inductors 91, 92, 93, and 94, a switch 95, the variable capacitance diode 96, an inductor 97, and the variable capacitance diode 98. The inductors 91 and 92 are connected in series with each other at a node 99 while the inductors 93 and 94 are connected in series with each other at a node 100. The switch 95 is connected between the node 100 and a node 101 provided between the inductor 92 and an anode of the variable capacitance diode 96. A cathode of the variable capacitance diode 96 is connected to one end of the inductor 97. The variable capacitance diode 98 is connected between the other end of the inductor 97 and the ground.

The frequency variable port 62a of the single-tuned filter 62 is connected to the cathode of the variable capacitance diode 98 and receives the tuning voltage supplied from the PLL circuit 78. In the single-tuned filter 62, capacitances of the variable capacitance diodes 96 and 98 are changed in response to the tuning voltage supplied to the frequency variable port 62a, thus determining the tuning frequency. According to Embodiment 1, in the single-tuned filter 62, values of components are determined to allow signals in the VHF band to pass through the filter.

The double-tuned filter 64 is composed of the variable capacitance diode 102 connected between an input port 64A and the ground, a series assembly including inductors 103 and 104 connected in series with each other and connected in parallel with the variable capacitance diode 102, and a switch 108 connected in parallel with the inductor 104. Inductors 105 and 106 inductively coupled with the inductors 103 and 104, respectively, are connected in series with each other. The series assembly of the inductors 105 and 106 is connected in parallel with the variable capacitance diode 107.

The frequency variable port 64a for receiving the tuning voltage supplied from the PLL circuit 78 is connected to cathodes of the variable capacitance diodes 102 and 107 via resistors 102A and 107A, respectively. In the double-tuned filter 64, capacitances of the variable capacitance diodes 102 and 107 are changed in response to the tuning voltage supplied to the frequency variable port 64a, thus determining the tuning frequency of the filter.

An operation of the RF signal receiver Embodiment 1 for receiving a television (TV) signal composed of signals in the UHF band and the VHF band assigned directly beneath the UHF band will be described.

For receiving the signal in the UHF band of the TV signal, the switch 67a is turned on while the switches 74a, 74b, 77a, and 77b are turned off.

For receiving the signal in a VHF high band of the VHF band, i.e., the higher part in the VHF band, the switches 74a and 77a are turned on while the switches 74b and 77b are turned off. Simultaneously, in the switch 67, the switch 67b is turned on for connecting an output port of the frequency divider 66a while the switches 95, 108, and 109 are turned on.

For receiving the signal in a VHF low band of the VHF band lower than the VHF high band, the switches 74b and 77b are turned on while the switches 74a and 77a are turned off. Simultaneously, the switch 67c is turned on while the switches 95, 108, and 109 are turned off.

The RF amplifier 53 is activated for receiving the signal in the UHF band while the RF amplifier 63 is activated for receiving the signal in the VHF band. The RF amplifier for receiving a signal not to be received is not activated, and the signal passing through the tuned filter 52 or 62 is not supplied to the mixer 55 or 65. Only an RF signal in a frequency band to be received is converted into an intermediate-frequency signal.

In the local oscillator 56 according to Embodiment 1, the inductor 68 has an inductance of 20 nH, and the capacitor 70 has a capacitance of 22 pF. The variable capacitance diode 69 has a capacitance varying from 31 pF to 2.7 pF. according to a change of a voltage supplied between both ends of the diode from 2V to 25V.

The local oscillator 56 can generate an oscillation frequency ranging from 350 MHz to 850 MHz for receiving the signal in the UHF band, ranging from 358 MHz to 814 MHz for receiving the signal in the VHF high band, and ranging from 404 MHz to 692 MHz for receiving the signal in the VHF low band.

For receiving signals in the UHF band, the oscillation frequency generated by the local oscillator 56 is supplied to the mixer 55 as it is, and the mixer 55 generates an intermediate-frequency signal of 45.75 MHz. For receiving signals in the VHF high band, the oscillation frequency generated by the local oscillator 56 is divided to ½ of the frequency by the frequency divider 66a and then transmitted to the mixer 65, and the mixer 65 generates an intermediate-frequency signal of 45.75 MHz. For receiving signals of the VHF low band in the NTSC system, the oscillation frequency generated by the local oscillator 56 is divided into ¼ by the frequency divider 66b, and then transmitted to the mixer 65, and the mixer generates an intermediate-frequency signal of 45.75 MHz.

It is essential that the tuning voltage supplied to the local oscillator is determined to be substantially equal to the tuning voltages supplied to the single-tuned filters 52 and 62 and the double-tuned filters 54 and 64 for receiving the signals in all frequency bands. More particularly, the single-tuned filters 52 and 62 and the double-tuned filters 54 and 64 preferably have characteristics of the frequencies to the tuning voltages similar to each other in all the frequency bands. For allowing the mixers 55 and 65 to generate the intermediate-frequency signals, the local oscillator 56 and the frequency dividers generate signals having frequencies higher by a range of the intermediate frequency than the tuning frequencies of the single-tuned filters 52 and 62 and the double-tuned filters 54 and 64. This is one of the most fundamental factors for RF receivers to receive RF signals.

Accordingly, the RF receiver of Embodiment 1 can receive all the channels of the television system in the USA ranging from the VHF low band to the UHF band, i.e., from 55.25 MHz to 801.25 MHz.

According to Embodiment 1, the capacitors 72, 73, 75, and 76 are switched with the switches 74 and 77 to slightly change capacitances in the tuning section 56A of the local oscillator 56, thus providing desired characteristics of the oscillation frequency optimum for each frequency band against the tuning voltage with the oscillator.

Upon one of the switches 74a and 74b being turned on, the capacitor 72 or 73 is connected in parallel with the variable capacitance diode 69. A smaller capacitance of the variable capacitance diode 69 causes the capacitance of the variable capacitance diode 69 to contribute less to the oscillation frequency of the local oscillator 56. As a result, a high oscillation frequency of the local oscillator 56 which corresponds to a small capacitance of the variable capacitance diode 69 can be changed.

One of the switches 77a and 77b is turned on, and capacitor 75 or 76 is connected in parallel with the capacitor 70. This arrangement reduces a capacitance connected in series with the variable capacitance diode 69, thus increasing the contribution of the capacitance of the variable capacitance diode 69 to the oscillation frequency of the local oscillator 56. As a result, a changeable range of the oscillation frequency of the local oscillator 56 corresponding to a changeable range in the tuning voltage can be changed.

Upon the capacitors 72, 73, 75, and 76 having appropriate capacitances, the relationship between the frequency and the tuning voltage can be determined independently for the UHF band, the VHF high band, and the VHF low band of broadcasting systems.

Upon the capacitors 72, 73, 75, and 76 having appropriate capacitances, the relationship between the frequency and the tuning voltage for the local oscillator 56 is made similar to the relationship between the tuning frequency and the tuning voltages for the single-tuned filters 52 and 62 and the double-tuned filters 54 and 64 Accordingly, the RF receiver of Embodiment 1 can receive all the channels of the television system in the U.S. ranging from the VHF low band to the UHF band, i.e., from 55.25 MHz to 801.25 MHz.

In the RF receiver of Embodiment 1, the variable capacitance diodes 69, 84, 86, 89, 98, 102, and 107 have characteristics of changes of capacitances substantially equal to each other. This allows the characteristics of the frequencies against the tuning voltages of the single-tuned filters 52 and 62, the double-tuned filters 54 and 64, and the tuning section 56A of the local oscillator 56 to be easily made similar to each other.

Since the VHF band, particularly the VHF high band, requires large changes of the capacitances in relation to the tuning voltages, the variable capacitance diodes 69, 84, 86, 89, 102, and 107 have capacitance-tuning voltage characteristics substantially equal to that of the variable capacitance diode 98 which determines the tuning frequency of the single-tuned filter 62 for the VHF band. As a result, all the variable capacitance diodes 69, 84, 86, 89, 98, 102, and 107 can be employ diodes of a single type, thus being controlled easily and eliminating errors during mounting.

Figure 4:
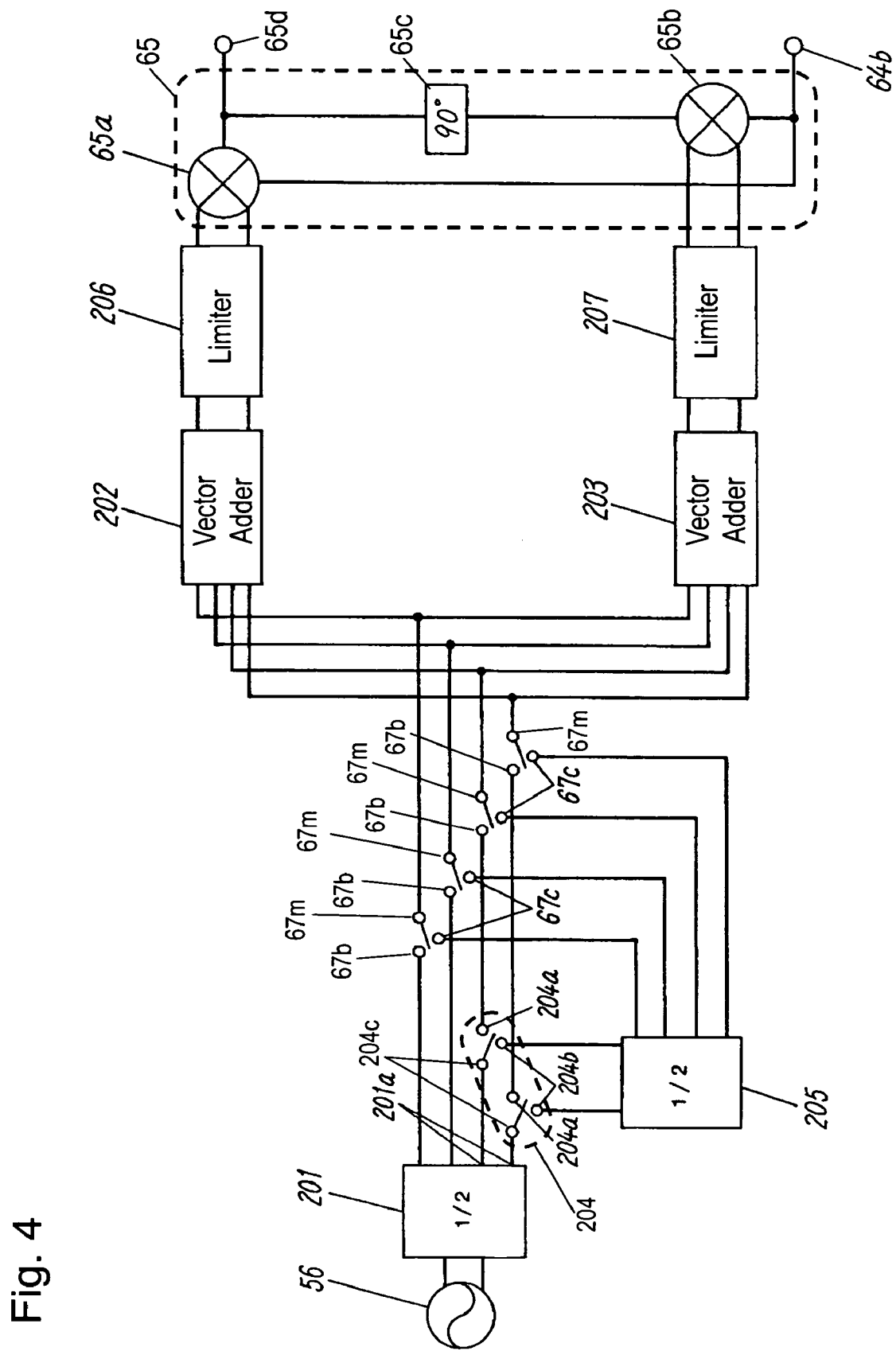
FIG. 4 is a block diagram of a frequency divider and mixers of the RF receiver according to Embodiment 1.

The frequency divider 66 and the mixer 65 of Embodiment 1 will be explained in more detail. FIG. 4 illustrates a block diagram of the frequency divider 66 and the mixer 65.

The local oscillator 56 is implemented by a balancing circuit which outputs two signals different in phase by 180 degrees from each other.

A ½ frequency divider 201 divides a frequency of a signal output from the local oscillator 56 into ½. A signal output from the ½ frequency divider 201 is supplied via a switch 67 to vector adders 202 and 203. Two output ports 201a of output ports of the ½ frequency divider 201 are connected to common ports 204c of a switch 204, and output ports 204a of the switch 204 are connected to input ports 67b of the switch 67.

Output ports 204b of the switch 204 are connected to a ½ frequency divider 205, and four output ports of the divider 205 are connected to the input ports 67c of the switch 67.

The ½ frequency divider 205 receives two signals output from the two output ports 201a of the ½ frequency divider 201 which are different in phase by 180 degrees from each other, and outputs four signals different in phase by 90 degrees from each other.

Limiters 206 and 207 regulate signals output from the vector adders 202 and 203 to predetermined levels, and transfers them to the mixer 65.

The mixer 65 includes a mixer 65a, a 90-degree phase shifter 65c connected to an output port 65d of the mixer 65a, and a mixer 65b connected in parallel with a series assembly having the mixer 65a and the phase shifter 65c connected in series with each other.

The mixer 65a has one input port connected to the output port 64b of the double tuned filter 64 and has other input port connected to the output port of the limiter 206. Similarly, the mixer 65b has one input port connected to the output port 64b of the double-tuned filter 64 and has other input port connected to an output port of the limiter 207. Output ports of the mixer 65a and the 90-degree phase shifter 65c are then connected to the output terminal 79.

For receiving a signal in the VHF high band, the switch 204 connects the common ports 204c to the output ports 204a, respectively, while the switch 67 connects common ports 67m to output ports 67b, respectively. For receiving a signal in the VHF low band, the switch 204 connects common port 204c to ports 204b, respectively, while the switch 67 connects common ports 67m to ports 67c, respectively. Then, the ½ frequency divider 205 is connected between the ½ frequency divider 201 and the vector adders 202 and 203 for dividing the frequency of the signal output from the local oscillator 56 into ¼.

Figure 5:
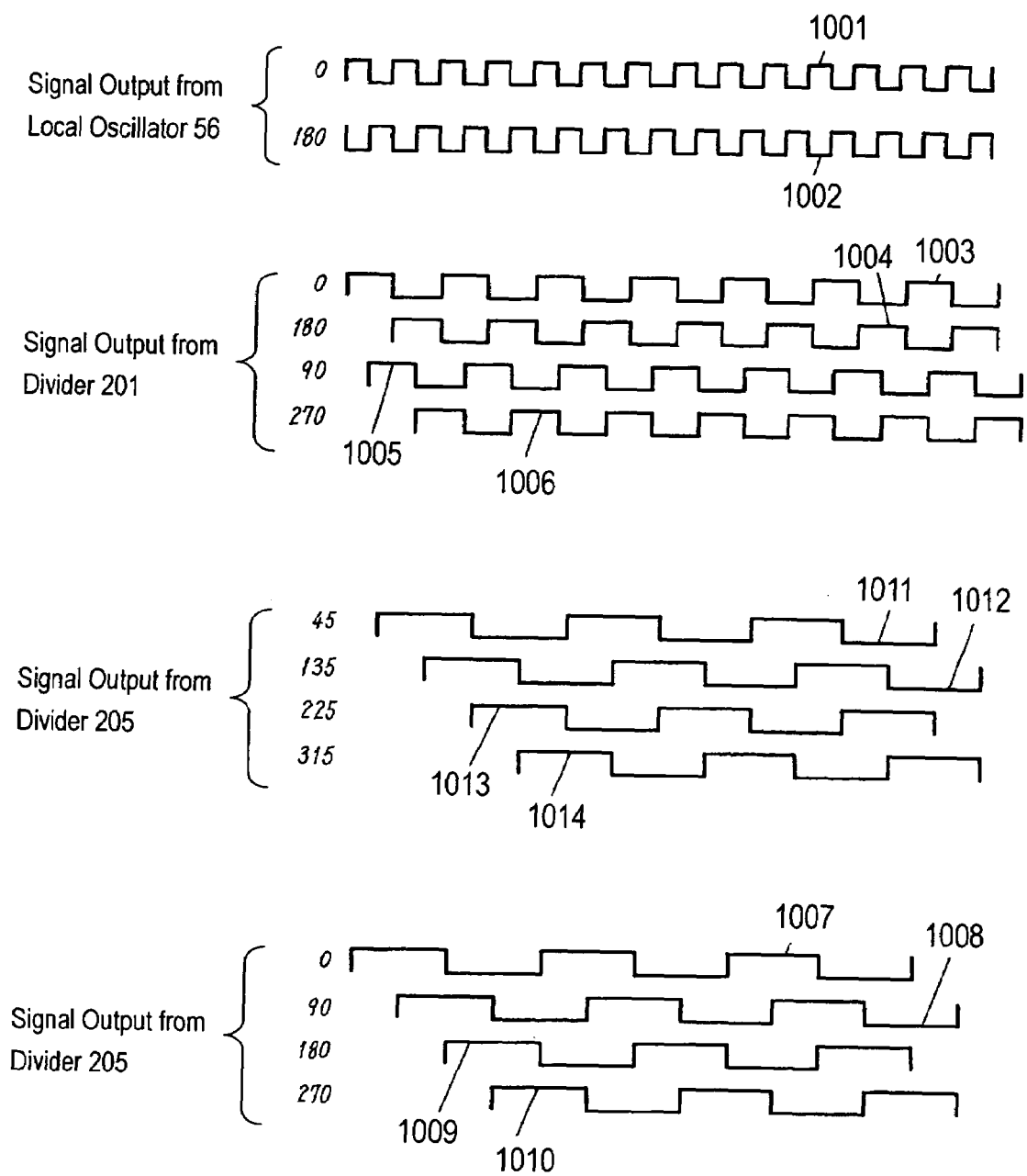
FIG. 5 illustrates signals in the RF receiver according to Embodiment 1.

Operations of the frequency dividers 201 and 205 and the vector adders 202 and 203 of Embodiment 1 will be explained in more detail. FIG. 5 is a time chart of signals in the receiver of Embodiment 1. The local oscillator 56 outputs a signal 1001 and a signal 1002 different in phase by 180 degrees from the signal 1001. The divider 201 receiving the signals 1001 and 1002, and outputs signals 1003, 1004, 1005, and 1006 different in phase by 90 degrees from each other.

The frequency divider 205 receives the signals 1005 and 1006, and outputs signals 1007, 1008, 1009, and 1010 different in phase by 90 degrees from each other.

The vector adder 202 combines signals having respective phases of 0 degree and 90 degrees, and generates a signal having a phase of 45 degrees, and further combines signals having respective phases of 180 degrees and 270 degrees, and generates a signal having a phase of 225 degrees. The vector adder 203 combines the signals having respective phases of 90 degrees and 180 degrees, and generates a signal having a phase of 135 degrees, and further combines the signals having respective phases of 0 degree and 270 degrees, and generates a signal having a phase of 315 degrees. That is, each of the vector adders 202 and 203 generates the signals different in phase by 90 degrees from each other.

The ½ frequency dividers 201 and 205 of Embodiment 1 are implemented by simple flip-flop circuits and can easily be installed in an integrated circuit.

Even if the frequency dividers 201 and 205 produce phase errors, the vector adders 202 and 203 and the limiters 206 and 207 steadily provide the signals different in phase by 90 degrees from each other. This structure provides an image-rejection mixer which provides signals having accurate phase relationship are obtained throughout a wide range of frequencies, and which suppresses image interference signal component.

The above structure allows the local oscillation signal to be generated only by the frequency divider 66 dividing the signal output from the local oscillator 56, thus providing the image rejection mixer having a small circuit arrangement.

According to Embodiment 1, the frequency divider 205 receives the signals 1005 and 1006, however may receive the signals 1003 and 1004. Even in the latter case, the signals 1011, 1012, 1013, and 1014 different in phase by 90 degrees from each other are provided. The frequency divider 205, upon receiving signals different in phase by 180 degrees from each other, outputs the four output signals different in phase by 90 degrees from each other.

The image rejection mixer is employed only as the mixer 65, hence allowing the RF receiver to have a simple circuit arrangement and to have a small size and a low cost.

The image rejection mixer suppresses an image interference component, hence allowing the single-tuned filter 62 and the double-tuned filter 64 to have a small attenuation for the image interference signal component. This mixer allows the double-tuned filter 64 to be replaced by, for example, a low-pass filter having a cutoff frequency which can be switched between the highest frequency in the VHF high band for receiving signals in the VHF low band and the highest frequency in the VHF low band for receiving signals in the VHF high band.

The local oscillator 56 includes an oscillation frequency adjuster section for changing the frequency of the oscillation signal in response to a frequency band to be received and according to the frequency characteristics of the single-tuned filter 62 and the double-tuned filter 64. This increases a varying range of the oscillation frequency of the local oscillator 56 according to the tuning voltage. As a result, the RF receiver of Embodiment 1 can receive a signal even if the UHF band and the VHF band are continuous.

The oscillation frequency adjuster section changes the oscillation frequency of the local oscillator 56 in response to the frequency band to be received and according to the frequency characteristics of the single-tuned filter 62 and the double-tuned filter 64. Hence, the center frequencies in passing ranges of the single-tuned filter 62 and the double-tuned filter 63 can be determined to be substantially equal to the frequency of the desired channel of the signal. Accordingly, the single-tuned filter 62 and the double-tuned filter 64 suppress undesired interference components of the signal, thus reducing image interference.

According to Embodiment 1, the oscillator 71, the switches 74 and 77, the frequency dividers 57 and 66, the mixers 55 and 65, and the PLL circuit 78 are integrated in a single package 2001 as an integrated circuit. This arrangement reduces the overall size of the RF receiver.

The integrated circuit has ports 121 and 122 connected to respective ones of both ends of the inductor 68, a port 123 connected to the capacitor 72, a port 124 connected to the capacitor 73, a port 125 connected to the capacitor 75, and a port 126 connected to the capacitor 76. The ports 123, 124, 125, and 126 are located between the ports 121 and 122. The ports 123 and 124 are located adjacent to the port 122 while the ports 125 and 126 are located adjacent to the port 121. This arrangement allows the tuning section 56A including the variable capacitance diode 69, the inductor 68, the capacitor 70, the capacitor 72, the capacitor 73, the capacitor 75, and the capacitor 76 to be connected by a short distance to the ports 121, 122, 123, 124, 125, and 126 of the integrated circuit 1001, thus eliminating unnecessary capacitance and inductance and contributing to high quality of design.

In the RF receiver of Embodiment 1, when the input signal is in the VHF high band, a dividing ratio of the frequency divider 66 is determined to be ½ while the oscillation frequency of the local oscillator 56 is determined to range substantially from 360 MHz to 820 MHz. Accordingly, the RF receiver can receive all the channels of the VHS high band.

In the radio-frequency receiver of Embodiment 1, when the input signal is in the VHF low band, the dividing ratio of the frequency divider 66 is determined to be ¼ while the oscillation frequency of the local oscillator 56 is determined to range substantially from 400 MHz to 700 MHz. Accordingly, the RF receiver can receive all the channels of the VHS low band of an NTSC format.

Further, in the RF receiver of Embodiment 1, when the input signal is in the VHF low band, the dividing ratio of the frequency divider 66 may be determined to be ⅕ while the oscillation frequency of the local oscillator 56 is determined to range substantially from 400 MHz to 900 MHz. This allows the RF receiver to receive all the channels of the VHS low band of a PAL format.

In the RF receiver of Embodiment 1, when the input signal is in the VHF band, the signal output from the frequency divider 56 may be supplied to the PLL circuit 78. This arrangement allows the PLL circuit 78 to accept tuning data of desired broadcast signals identical to that of a widely-marketed RF receiver which includes local oscillators corresponding to broadcast frequency bands, respectively.

(Exemplary Embodiment 2)

Figure 6:
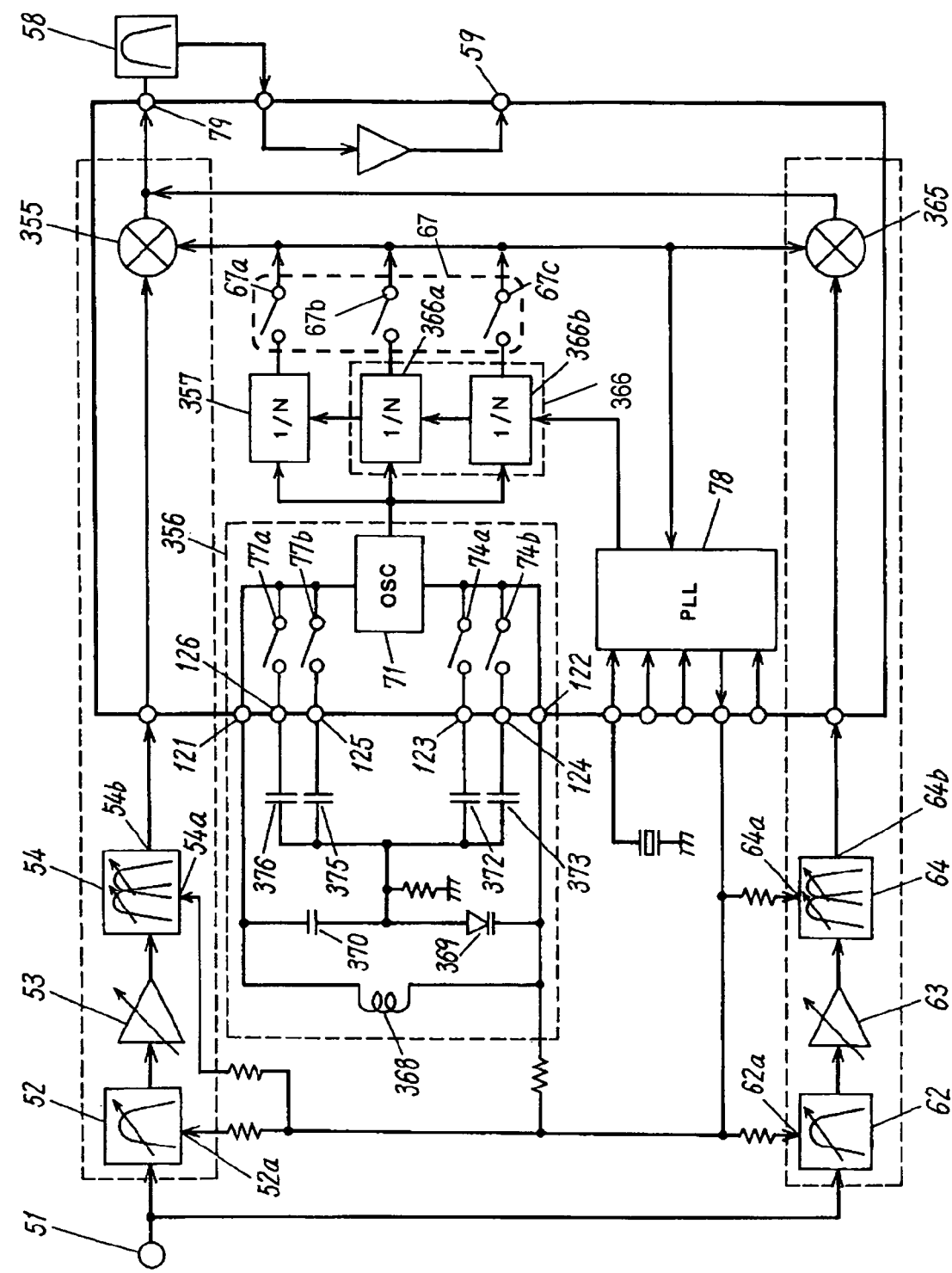
FIG. 6 is a block diagram of an RF receiver according to Exemplary Embodiment 2 of the invention.

FIG. 6 is a block diagram of a radio-frequency (RF) receiver according to Exemplary Embodiment 2 of the present invention. The same components as those of Embodiment 1 shown in FIG. 1 are denoted by the same reference numerals and will be explained in no more detail.

A local oscillator 356 generates a signal having a frequency ranging from 700 MHz to 1700 MHz, which is twice greater than that of the local oscillator 56 of Embodiment 1 shown in FIG. 1. The local oscillator 356 includes an inductor 368 and a variable capacitance diode 369 to generate the signal of the oscillation frequency ranging from 700 MHz to 1700 MHz. Upon capacitances of capacitors 372, 373, 375, and 376 being determined appropriately, characteristics of frequency changes against tuning voltages of the single-tuned filters 52 and 62 and the double-tuned filters 54 and 64 are made similar to each other, so that their passing frequency is differentiated by a range of an intermediate-frequency signal (45.75 MHz) from the oscillation frequency of the local oscillator 356.

According to Embodiment 2, a mixer 355 also operates as an image rejection mixer. A frequency divider 366a has a dividing ratio of ¼ while a frequency divider 366b has a dividing ratio of ⅛. A frequency divider 357 and a switch 67a are connected between the local oscillator 356 and the mixer 355. Signals output from the mixers 355 and 365 are supplied via an output port 79 to an intermediate-frequency filter 58.

Figure 7:
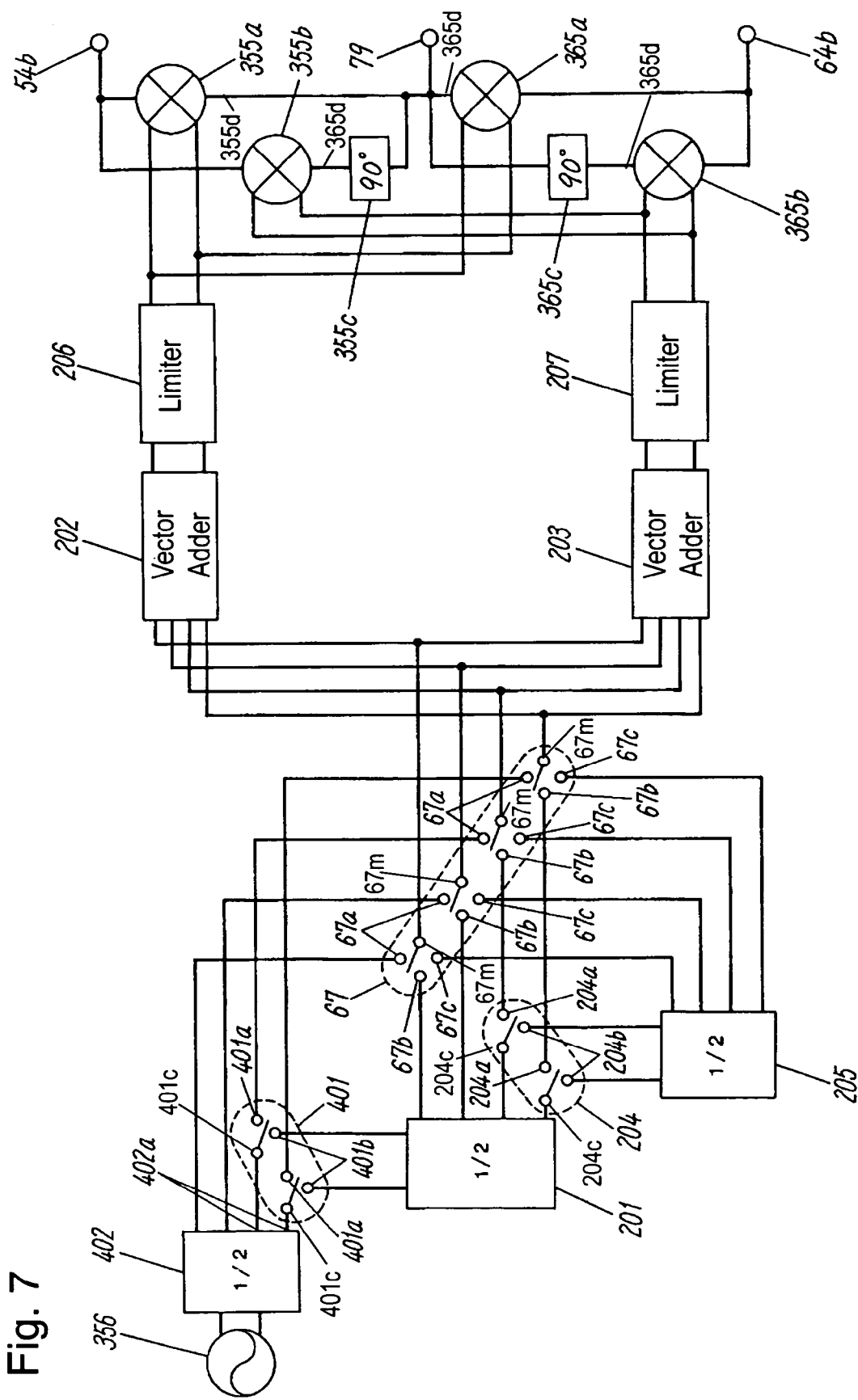
FIG. 7 is a detailed block diagram of a frequency divider and mixers of the RF receiver according to Embodiment 2.

An operation of the frequency dividers 357 and 366 and the mixers 355 and 365 will be explained. FIG. 7 illustrates a block diagram of the dividers and mixers of Embodiment 2. In FIG. 7, the same components as those of Embodiment 1 shown in FIGS. 1, 4, and 5 are dented by the same reference numerals and will be explained in no more detail.

As shown in FIG. 7, a mixer 355a has one input port connected to an output port 54b of the double tuned filter 54 and has other input port connected to an output of a limiter 206. A mixer 355b has one input port connected to an output port 54b of the double-tuned filter 54 and has other input port connected to an output of a limiter 207. The mixer 355b has an output port 355d connected to a 90-degree phase shifter 355c. The mixer 355a is connected in parallel with a series assembly having the mixer 355b and the 90-degree phase shifter 355c connected in series with each other. The output port 355d of the mixer 355a and an output port of the 90-degree phase shifter 355c are connected to the output port 79.

A mixer 365a has one input port connected to an output port 64b of the double-tuned filter 64 and has other input port connected to an output of a limiter 206. A mixer 365b has one input port connected to output port 64b of the double-tuned filter 64 and has other input port of a limiter 207. The mixer 365b has an output port 365d connected to a 90-degree phase shifter 365c. The mixer 365a is connected in parallel with a series assembly having the mixer 365b and the 90-degree phase shifter 365c connected in series with each other. The output port 365d of the mixer 365a and the output port of the 90-degree phase shifter 365c are connected with the output port 79.

According to Embodiment 2, a switch 67 has three input ports and one common port. The common port of the switch 67 is connected to input ports of vector adders 202 and 203. A ½ frequency divider 402 is connected between a port 67a of the switch 67 and the local oscillator 356 and divides a frequency of a signal output from the local oscillator 356 into ½ and outputs four signals different in phase 90 degrees.

Two output ports 402a of the frequency divider 402 are connected to common ports 401c of a switch 401, and ports 401a of the switch 402 are connected to ports 67a of the switch 67. Other ports 401b of the switch 401 are connected to input ports of the ½ frequency divider 201. The frequency divider 402 outputs two signals having phases of 0 degree and 180 degrees, respectively, from output ports 402a. The frequency divider 201 may receive signals different in phase by 180 degrees from each other. Signals having phases of 90 degrees and 270 degrees, respectively may be supplied to the divider 201 from the divider 402.

For receiving signals in a UHF band, the switch 401 connects the common ports 401c to the ports 401a while the switch 67 connects common ports 67m to ports 67a. This allows the vector adders 202 and 203 to receive a signal having ½ the frequency of the oscillation signal of the local oscillator 356.

For receiving signals in a VHF high band, the switch 401 connects common ports 401c to ports 401b while the switch 67 connects common ports 67m to ports 67b. The switch 204 connects common ports 204c to port 204a. This allows the ½ frequency dividers 402 and 201 to be connected between the local oscillator 356 and the vector adders 202 and 203. Accordingly, each of the vector adders 202 and 203 receives a signal having ¼ the frequency of the oscillation signal of the local oscillator 356.

For receiving signals in a VHF low band, the switch 401 connects common ports 401c to ports 401b while the switch 67 connects common ports 67m to ports 67c. The switch 204 connects common ports 204c to ports 204b. This allows the ½ frequency dividers 402, 201, and 205 to be connected between the local oscillator 356 and the vector adders 202 and 203. Accordingly, each of the vector adders 202 and 203 can receive a signal having ⅛ the frequency of the oscillation signal from the local oscillator 356.

The above described arrangement allows each of the vector adders 202 and 203 to receive four signals different in phase by 90 degrees from each other regardless of a frequency band to be received. For receiving a signal in the UHF band, the mixers 355a and 355b and the 90-degree phase shifter 355c mix the signal with signals output from the vector adders 202 and 203. This arrangement provides an image rejection mixer with a UHF band receiver section, the RF receiver of Embodiment 2 can suppress image interfering components in the UHF band.

The RF receiver of Embodiment 2 includes the image rejection mixers for suppressing image interfering components in at both the VHF band and the UHF band, hence allowing the single-tuned filter 52 and the double-tuned filter 54 to have a small attenuation for signals causing image interfering. Accordingly, the double-tuned filter 54 may be replaced by, fir example, a high pass filter for passing the UHF band and higher frequency range.

Even if the signals output from the frequency divider 402 have phase errors, the vector adders compensate the phase error, hence providing signals different in phase by 90 degrees throughout a wide frequency range accurately. As a result, the RF receiver suppressing interference even when receiving a signal in the UHF band is provided.

In the RF receiver of Embodiment 2, a dividing ratio of the frequency divider 366 is determined to be ½ while the oscillation frequency of the local oscillator 356 ranges substantially from 720 MHz to 1800 MHz. The RF receiver, since having the image rejection mixer, can suppress image interfering even if passing bands of the tuned filters are not matched with the frequency of received signals. This permits the tuned-filters not to have a large attenuation for signals which may cause the image interfering.

(Exemplary Embodiment 3)

According to Exemplary Embodiment 3 of the present invention, a VHF signal receiver section 61 of a radio-frequency (RF) receiver of Embodiment 1 shown in FIG. 1 employs an image rejection mixer for receiving a VHF high band and employs a harmonic rejection mixer for receiving a VHF low band.

Figure 8:
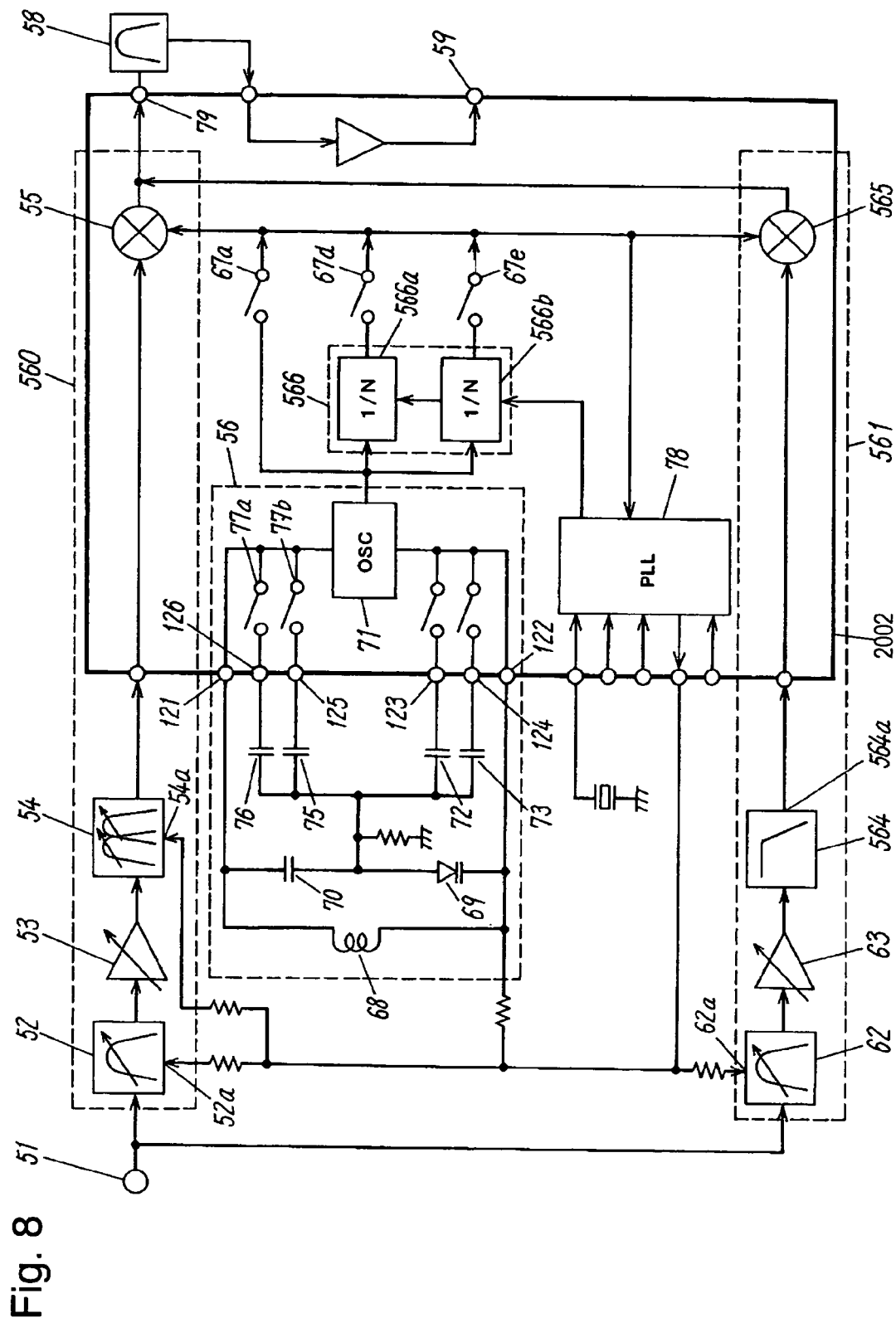
FIG. 8 is a block diagram of an RF receiver according to Exemplary Embodiment 3 of the invention.

FIG. 8 is a block diagram of the RF receiver of Embodiment 3. The same components as those of Embodiment 1 shown in FIG. 1 are denoted by the same reference numerals and will be explained in no more detail. An RF signal having a frequency ranging from 55.25 MHz to 801.25 MHz is input to an input terminal 51 A UHF band receiver section 560 includes a single-tuned filter 52, an RF amplifier 53, a double-tuned filter 54, a mixer 55, and an intermediate frequency filter 58.

A VHF band receiver section 561 connected to the input terminal 51 receives signals in a VHF band ranging from 55.25 MHz to 361.25 MHz. The VHF band receiver section 561 includes a single-tuned filter 62, an RF amplifier 63, a low pass filter 564, and a mixer 565 connected in this order.

The low pass filter 564 allows a signal in the VHF band which is not higher than 361.25 MHz in a signal output from the RF amplifier 63 to pass through the filter.

The mixer 565 has one input connected to an output port 564a of the low pass filter 564 and has other input coupled to an output port of the local oscillator 56 via a frequency divider 566. The mixer 565 mixes a signal in the VHF band passing through the low pass filter 564 with the oscillation signal from the local oscillator 56 to convert the signal passing through the low pass filter into an intermediate-frequency signal (45.75 MHz). The intermediate-frequency signal from the mixer 565 is supplied via an output terminal 79 to an intermediate-frequency filter 58.

The frequency divider 566 includes a frequency divider 566b for the VHF low band and a frequency divider 566a for the VHF high band. The switch 67 switches signals supplied from the local oscillator 56 and the frequency dividers 566a and 566b, and selectively supplies them to the mixer 565.

An operation of the RF receiver of Embodiment 2 for receiving a television (TV) broadcast signal, which includes the VHF high band and the VHF low band under the VHF high band, will be described.

The local oscillator 56 generates a signal having an oscillation frequency ranging from 358 MHz to 814 MHz for receiving signals in the VHF high band and generates a signal having an oscillation frequency ranging from 404 MHz to 692 MHz for receiving signals in the VHF low band.

When the signals in the VHF high band is received, the oscillation frequency of the local oscillator 56 is divided to ½ by the frequency divider 566a and supplied to the mixer 565 to provide an intermediate-frequency signal of 45.75 MHz. When the signals in the VHF low band of an NTSC format is received, the oscillation frequency of the local oscillator 56 is divided to ¼ by the frequency divider 566b and supplied to the mixer 565 to provide an intermediate-frequency signal of 45.75 MHz.

Figure 9:
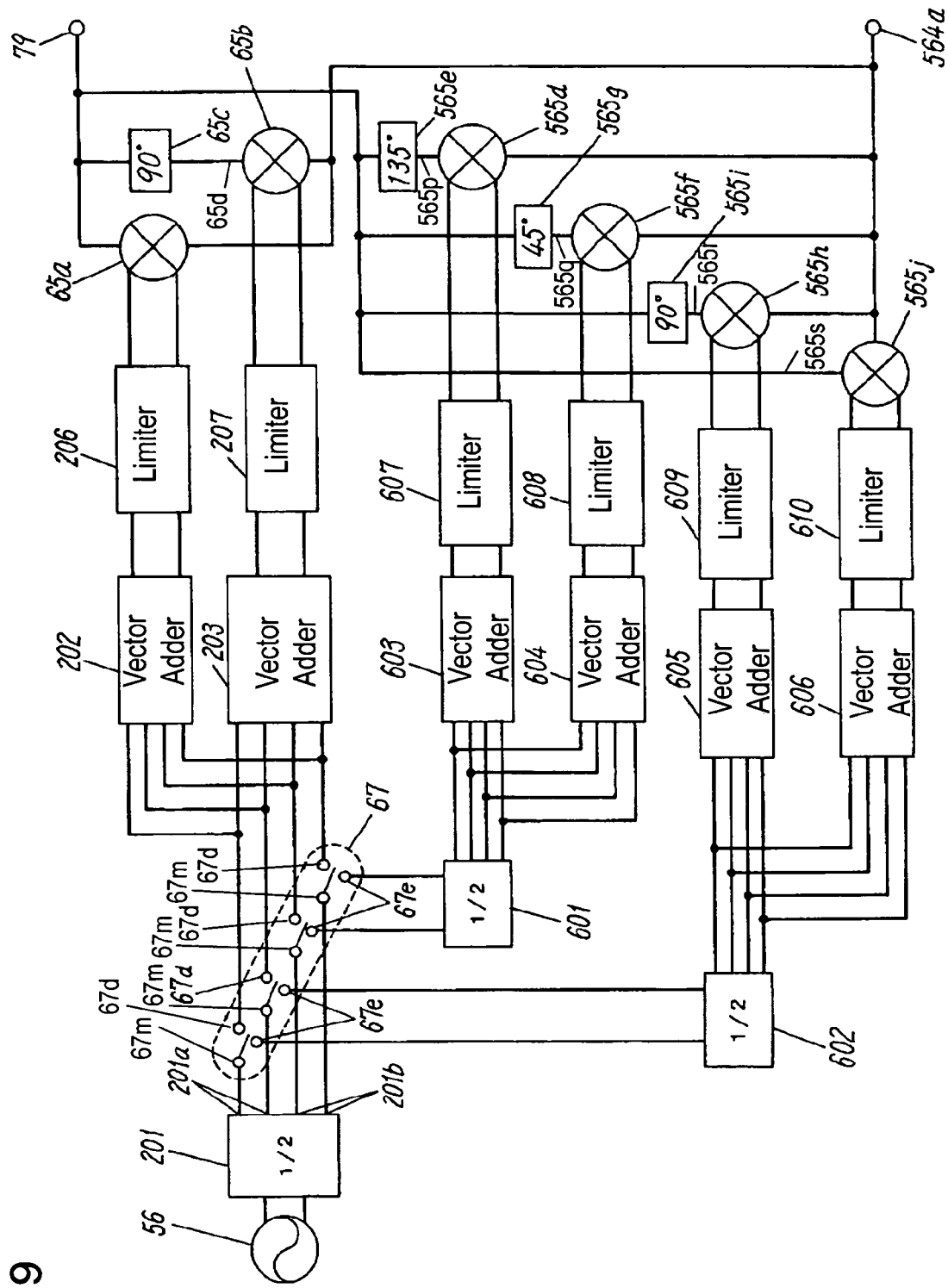
FIG. 9 is a block diagram of a frequency divider and mixers of the RF receiver according to Embodiment 3.

The frequency divider 566 and the mixer 565 of Embodiment 3 will now be described in more detail. FIG. 9 illustrates a block diagram of the frequency divider 566 and the mixer 565. In FIG. 9, the same components as those shown in FIG. 4 are denoted by the same reference numerals and will be explained in no more detail.

As shown in FIG. 9, the mixer 565 includes a mixer 65b, a 90-degree phase shifter 65c connected to an output port 65d of the mixer 65b, and a mixer 65a connected in parallel with an assembly having the mixer 65b and the 90-degree phase shifter 65c. The mixer 65a has one input port connected to an output port 564a of the low pass filter 564 and has other input port connected to an output port of a limiter 206. The mixer 65b has one input port connected to the output port 564a of the low pass filter 564 and has other input port connected to an output port of a limiter 207.

Common ports 67m of a switch 67 are connected to output ports 201a and 201b, and ports 67d of the switch 67 are connected to vector adder 202 and 203.

½ frequency dividers 601 and 602 are connected to ports 67e of the switch 67 and divide a signal output from the ½ frequency divider 201 into ½. The ½ frequency divider 601 receives a signal from the output port 201b of the ½ frequency divider 201 via the switch 67. The ½ frequency divider 602 receives a signal from the output port 201a of the ½ frequency divider 201 via the switch 67.

Each of the vector adders 603 and 604 receives four signals different in phase by 90 degrees from the ½ frequency divider 601 and vector-adds them. Each of vector adders 605 and 606 receives four signals different in phase by 90 degrees from the ½ frequency divider 602 and vector-adds them.

Limiters 607, 608, 609, and 610 limit levels of signals output from the vector adders 603, 604, 605, and 606 to predetermined levels, respectively. The mixers 565d, 565f, 565h, and 565j have respective one input ports connected to output ports of the limiters 607, 608, 609, and 610, respectively, and have respective other input ports connected to an output port 564a of the low pass filter 564.

The mixer 565d has an output port 565p connected to a 135-degree phase shifter 565e. The mixer 565f has an output port 565q connected to a 45-degree phase shifter 565g. The mixer 565h has an output port 565r connected to a 90-degree phase shifter 565i. Output ports of the phase shifters 565e, 565g, and 565i and an output port 565s of the mixer 565j are connected with an output terminal 79.

When a signal in the VHF high band is received, the switch 67 connects the common ports 67m to ports 67d to supply signals of ½ the oscillation frequency of the local oscillator 56 to the mixers 65a and 65b.

When a signal in the VHF low band is received, the switch 67 connects the common port 67m to ports 67e to supply a signal output from the ½ frequency divider 201 to the frequency dividers 601 and 602 to provide a signal of ¼ the oscillation frequency of the local oscillator 56.

Figure 10:
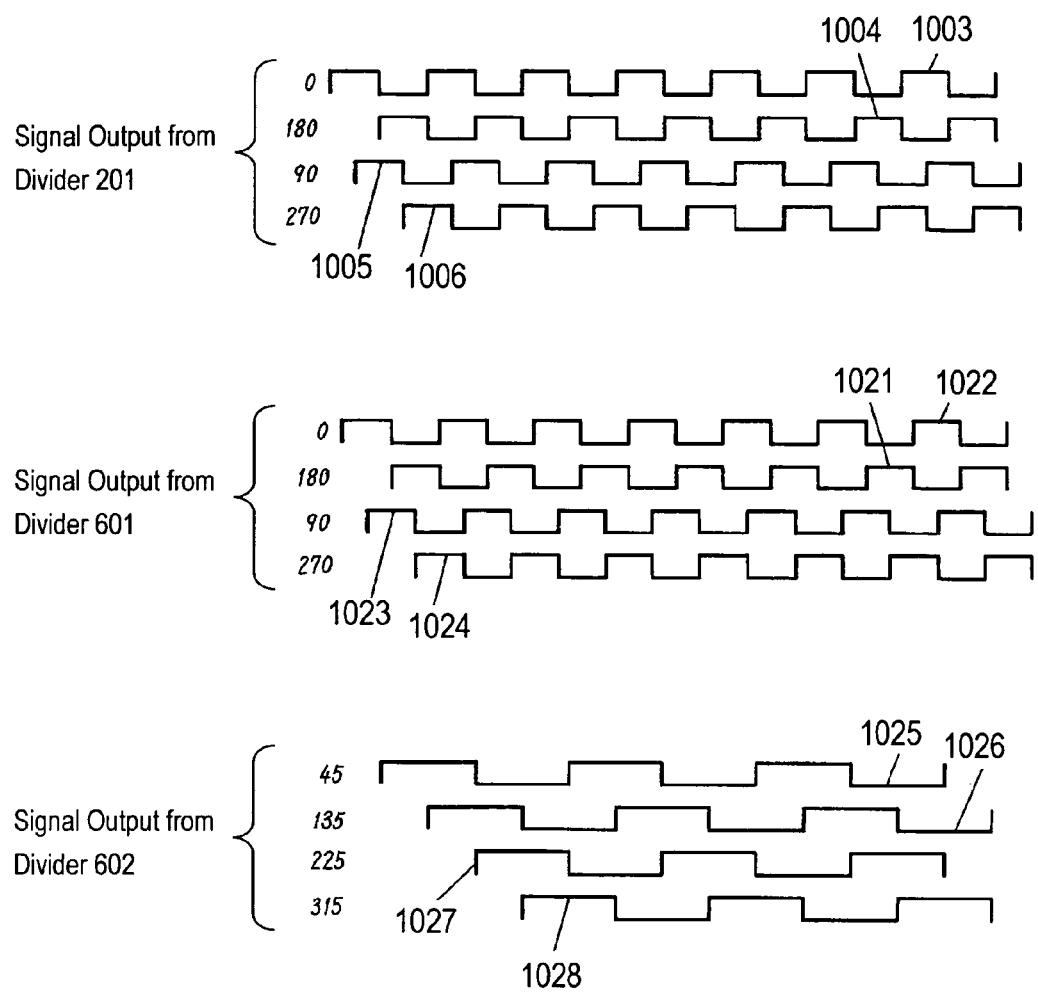
FIG. 10 illustrates signals in the RF receiver according to Embodiment 3.

Operations of the frequency dividers 201, 601, and 602 and the vector adders 202, 203, 604, 604, 605, and 606 will be explained. FIG. 10 illustrates a time chart of signals of the frequency dividers 601 and 602. In FIG. 10, the same signals as those shown in FIG. 5 are denoted by the same reference numerals and will be explained in no more detail.

As shown in FIG. 10, signals 1021, 1022, 1023, and 1024 output from the frequency divider 601 are obtained by frequency-dividing signals 1003 and 1004 output from the frequency divider 201. According to Embodiment 3, the signal 1021 has a phase of 0 degree, the signal 1022 has a phase of 90 degrees, the signal 1023 has a phase of 180 degrees, and the signal 1024 has a phase of 270 degrees.

Signals 1025, 1026, 1027, and 1028 output from the frequency divider 602 are obtained by frequency-dividing signals 1005 and 1006 output from the frequency divider 201. According to Embodiment 3, the signal 1025 has a phase of 45 degrees, the signal 1026 has a phase of 135 degrees, the signal 1027 has a phase of 225 degrees, and the signal 1028 has a phase of 315 degrees.

The oscillation frequency of the local oscillator 65 is frequency-divided, and the vector adders 603, 604, 605, and 606 generates signals 1021, 1022, 1023, 1024, 1025, 1026, 1027, and 1028 different in phase by 45 degrees. The vector adder 603 combines the signal 1022 having the phase of 90 degrees and the signal 1023 having the phase of 180 degrees to output a signal having a phase of 135 degrees, and combines the signal 1021 having the phase of 0 degrees and the signal 1024 having the phase of 270 degrees to output a signal having a phase of 315 degrees. The vector adder 604 combines the signal 1021 having the phase of 0 degrees and the signal 1022 having the phase of 90 degrees to output a signal having a phase of 45 degrees, and combines the signal 1023 having the phase of 180 degrees and the signal 1024 having the phase of 270 degrees to output a signal having a phase of 225 degrees. The vector adder 605 combines the signal 1025 having the phase of 45 degrees and the signal 1026 having the phase of 135 degrees to output a signal having a phase of 90 degrees, and combines the signal 1027 having the phase of 225 degrees and the signal 1028 having the phase of 315 degrees to output a signal having a phase of 270 degrees. The vector adder 606 combines the signal 1025 having the phase of 45 degrees and the signal 1028 having the phase of 315 degrees to output a signal having a phase of 0 degrees, and combines the signal 1026 having the phase of 135 degrees and the signal 1027 having the phase of 225 degrees to output a signal having a phase of 180 degrees.

As described above, the frequency dividers 201, 601, and 602 function as phase shifters. When a signal in the VHF high band is received, the mixers 565a and 565b form an image rejection mixer (IRM). When a signal in the VHF low band is received, the mixers 565d, 565f, 565h, and 565j form a harmonic rejection mixer (HRM). Such arrangement in the RF receiver of Embodiment 3 can suppress image interfering components in the VHF high band and suppress interfering in the VHF low band due to high-order harmonic interfering components output from the local oscillator. The HRM according to Embodiment 3 is implemented by the four mixers, hence suppressing harmonics not five times greater than a frequency of a signal output from the frequency divider 566b for the VHF low band.

In the RF receiver including the local oscillator and the frequency dividers, the frequency dividers for the VHF low band have dividing ratio smaller than those of the frequency dividers for the VHF high band. This provides the IRM for the VHF high band, and the HRM for the VHF low band, in which harmonic interfering occurs.

Since image interference components and harmonic interfering are suppressed by the IRM and HRM, the RF receiver of Embodiment 3 can includes a low pass filter. The HRM provided for the VHF low band reduces influences to signals in the VHF high band, in which the harmonic components cause the interfering. It is hence unnecessary to include a low pass filter for the VHF low band, and the HRM function is implemented by only the VHF low pass filter 564 having a fixed cut-off frequency, hence allowing the RF receiver not to include the complicated tuned filters and to be inexpensive. The low pass filter having the fixed cut-off frequency reduces a loss of a signal in a desired banc, hence improving a CN ratio of the RF receiver.

The ½ frequency dividers 201, 205, 601, and 602 of Embodiment 3 may be implemented by flip-flop circuits having simple structures, hence being assembled in an integrated circuit easily.

Even if the signals output from the frequency dividers 201, 205, 601, and 602 contain phase errors, the vector adders 202, 203, 603, 604, 605, and 606 provides the signals different in phase accurately. Therefore, signals accurately different in phase are obtained even in a wide frequency band, such as the VHF band, hence suppressing the image interfering and harmonic components stably.

According to Embodiment 3, the oscillator 71, the switches 67 and 77, the frequency divider 566, the mixers 55 and 565, and the PLL circuit 78 are integrated in a package 2002 to be integrated as an integrated circuit. This arrangement reduces the overall size of the RF receiver.

The frequency divider 566, upon having a dividing ratio of ⅓, can raise an oscillation frequency of the oscillator 56. The oscillator 56 has a high oscillation frequency particularly for the VHF low band. Accordingly, an inductor in the oscillator 56 can have a small size, hence being accommodated in the integrated circuit.

(Exemplary Embodiment 4)

Figure 11:
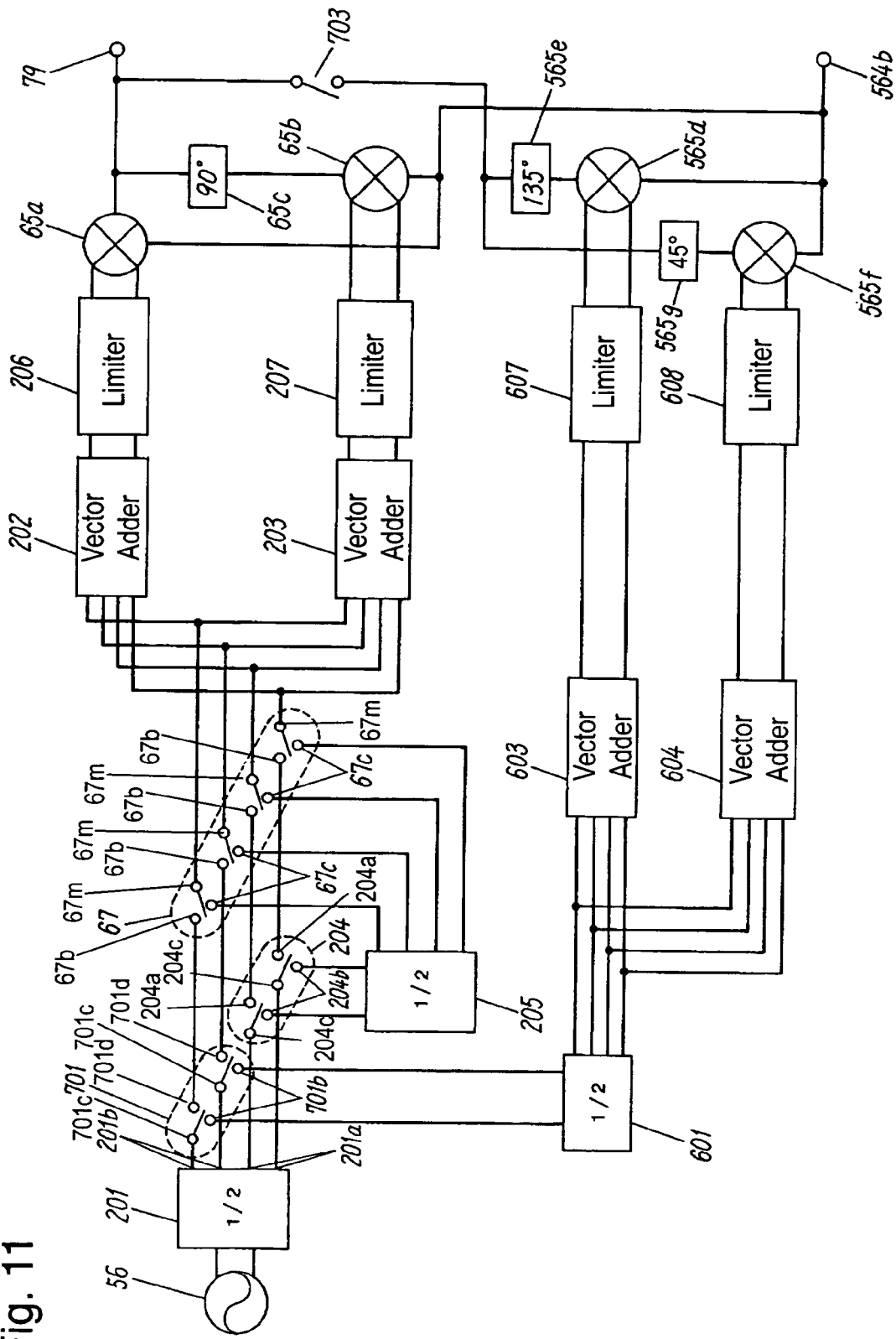
FIG. 11 is a block diagram of a frequency divider and mixers of an RF receiver according to Embodiment 4.
Figure 12:
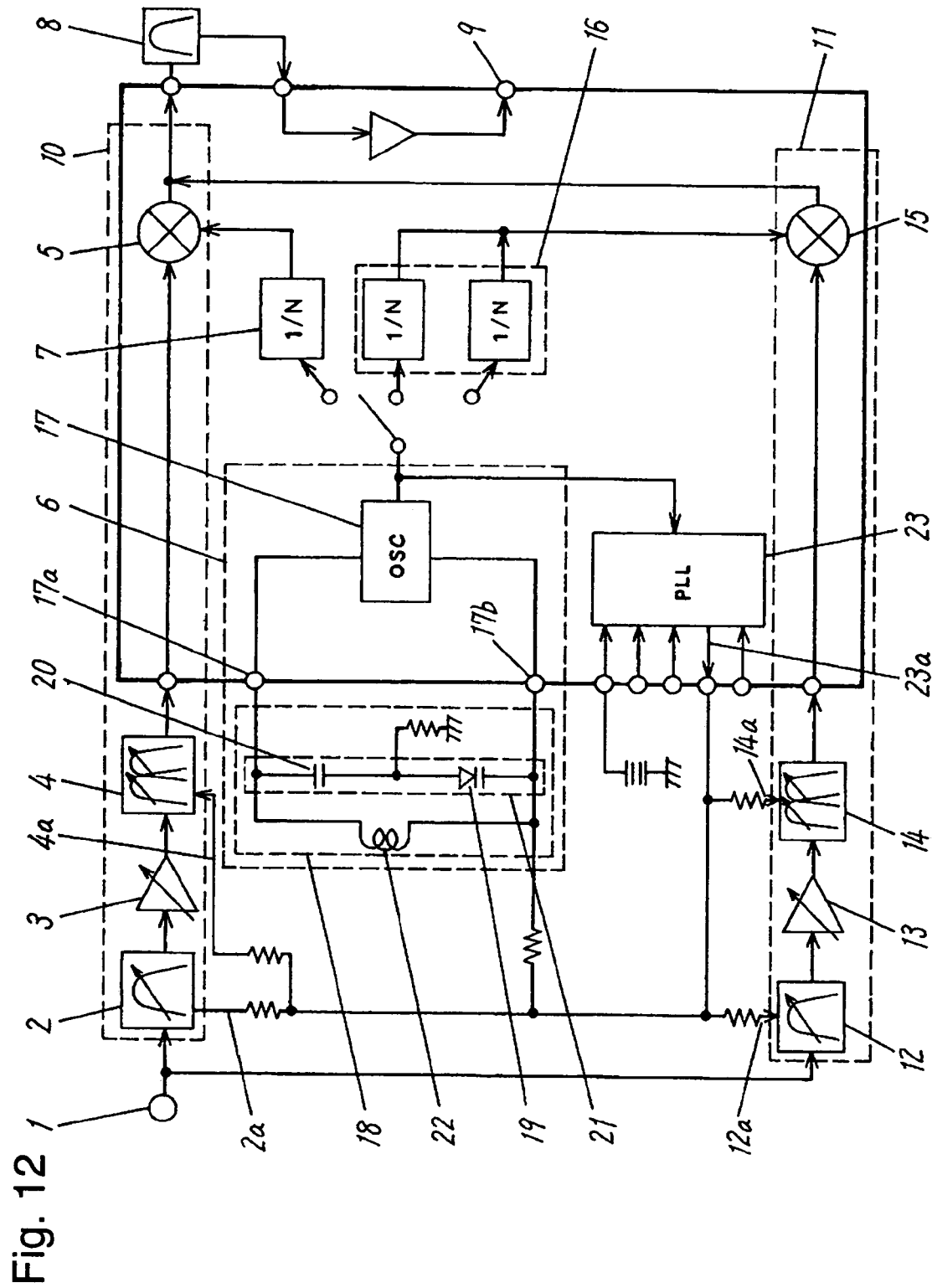
FIG. 12 is a block diagram of a conventional RF receiver.

FIG. 11 is a block diagram of frequency dividers and mixers according to Exemplary Embodiment 4 of the present invention. In FIG. 11, the same components as those shown in FIGS. 4, 7, and 8 are denoted by the same reference numerals and will be explained in no more detail. In an image rejection mixer (IRM) according to Embodiment 4, a switch 701 is connected between an output port 201b of a ½ frequency divider 201 and a port 67b of a switch 67 of an IRM of Embodiment 1 shown in FIG. 4. Common ports 701c of the switch 701 are connected to output ports of the ½ frequency divider 201, and ports 701a are connected to ports 67b of the switch 67. Port 701b of the switch 701 is connected to an input port of the ½ frequency divider 601. The switch 701 is activated with switches 67 and 204.

When a signal in the VHF high band is received, the switch 701 connects the common ports 701c to the ports 701a, and the switch 204 connects common ports 204c to the ports 204a. Simultaneously, the switch 67 connects the common ports 67m to ports 67b. Accordingly, a local oscillator 56, the ½ frequency divider 201, vector adders 202 and 204, limiters 206 and 207, mixers 65a and 65b, and a 90-degree phase shifter 65c forms an IRM.

When a signal in the VHF low band is received, the switch 701 connects common ports 701c to ports 701b, and the switch 204 connects common ports 204c to ports 204b. Simultaneously, the switch 67 connects common ports 67m to ports 67c. Accordingly, the local oscillator 56, ½ frequency dividers 201, 205, and 601, vector adders 202, 203, 603, and 604, limiters 206, 207, 607, and 608, mixers 65a, 65b, 565b, and 565f, and phase shifters 65c, 565e, and 565g form a harmonic rejection mixer (HRM).

The RF receiver of Embodiment 4 having the above described arrangement operates as the HRM for receiving signals in the VHF low band and operates as the IRM for receiving signals in the VHF high band. This allows the mixer 65 to be commonly used within a whole frequency range of the VHF band. Accordingly, the RF receiver has a small circuitry arrangement and a small overall size.

According to Embodiment 4, when s signal in the VHF band is received, the switch 701 connects the common ports 701c to the ports 701b and, the switch 204 connects the common ports 204c to the ports 204b. Simultaneously, the switch 67 connects the common ports 67m to the ports 67c.

In the RF receiver of Embodiment 4, ordinarily, the switch 701 may connect the common ports 701c to the ports 701a, the switch 204 may connect the common ports 204c to the ports 204a, and the switch 67 may connects the common ports 67m to the ports 67b. This operation allows the local oscillator 56, the ½ frequency divider 201, the vector adders 202 and 203, the limiters 206 and 207, the mixers 65a and 65b, and the 90-degree phase shifter 65c to operate as the IRM in both the VHF high band and the VHF low band In this case, a value indicating quality of signals, such as bit error rates after decoding process, may be monitored. Only when the value is lower than a predetermined level, the switch 701 may connect the common ports 701c to the ports 701b, and the switch 204 may connect the common ports 204c to the ports 204b. Then, the switch 67 may connect the common ports 67m to the ports 67c. This allows the local oscillator, the frequency divider, the vector adders, the limiters, the mixers, and the phase shifter to form the HRM. In this case, the local oscillator 56, the ½ frequency divider 201, the vector adders 202 and 203, the limiters 206 and 207, the mixers 65a and 65b, and the 90-degree phase shifter 65c ordinarily operate as the IRM, hence reducing the number of operating portions and power consumption. Hence, the RF receiver of Embodiment 4 is suitable for a portable receiver.

What is claimed is:

1. A radio-frequency (RF) receiver comprising:
    an input terminal for receiving an RF signal in a first frequency band and an RF signal in a second frequency band lower than the first frequency band;
    a first tuned filter connected with the input terminal and allowing a signal of a passing frequency in the RF signal in the first frequency band to pass through the first tuned filter;
    a local oscillator;
    a frequency divider for frequency-dividing a signal output from the local oscillator;
    a first mixer operable to mix a signal output from the first tuned filter with the signal output from the local oscillator to convert the signal output from the first tuned filter into a signal of an intermediate frequency;
    a second tuned filter connected with the input terminal and allowing a signal of a passing frequency of the RF signal in the second frequency band to pass through the second tuned filter;
    a second mixer operable to mix a signal output from the second tuned filter with a signal output from the frequency divider to convert the signal output from the second tuned filter into a signal of the intermediate frequency;
    an output terminal for outputting the signals of the intermediate frequency output from the first mixer and the second mixer; and
    a phase-locked-loop (PLL) circuit operable to control an oscillation frequency of the local oscillator, the passing frequency of the first tuned filter, and the passing frequency of the second tuned filter,
    wherein the signal output from the frequency divider contains a first output signal and a second output signal different in phase by 90 degrees from the first output signal, the first and second output signal being produced by frequency-dividing the signal output from the local oscillator,
    wherein the second mixer includes
        a third mixer operable to mix the signal output from the second tuned filter with the first output signal of the frequency divider,
        a first phase shifter operable to shift a signal output from the third mixer in phase by 90 degrees, and
        a fourth mixer operable to mix the signal output from the second tuned filter with the second output signal of the frequency divider, and
    wherein a signal output from the fourth mixer and a signal output from the first phase shifter are output from the output terminal.

2. The RF receiver according to claim 1,
    wherein the local oscillator includes
        an oscillator section operable to generate the signal output from the local oscillator,
        an oscillation frequency adjuster section operable to change the oscillation frequency of the oscillator,
        a series assembly connected with the oscillator section, the series assembly having a first variable capacitance diode and a first capacitor connected in series with each other; and
        an inductor connected in parallel with the series assembly,
    wherein the first tuned filter includes a second variable capacitance diode,
    wherein the second tuned filter includes a third variable capacitance diode, and
    wherein the PLL circuit is operable to supply tuning voltages to the first variable capacitance diode, the second variable capacitance diode, and the third variable capacitance diode.

3. The RF receiver according to claim 2, wherein the oscillation frequency adjuster section is operable to
    allow the oscillator section to generate a signal of a first predetermined frequency when said RF receiver receives a signal in the first frequency band, and
    allow the oscillation section to change the oscillation frequency to output a signal of a second predetermined frequency when said RF receiver receives a signal in the second frequency band.

4. The RF receiver according to claim 2, wherein the oscillation frequency adjuster section includes
    a second capacitor connected in parallel with the first variable capacitance diode, and
    a capacitance adjuster section connected with the first capacitor and the second capacitor, the capacitance adjuster section being operable to change capacitances of the first capacitor and the second capacitor in response to a frequency band to be received.

5. The RF receiver according to claim 4,
    wherein the first capacitor comprises a third capacitor and a fourth capacitor connected in parallel with the third capacitor, and
    wherein the capacitance adjuster section is operable to switch a capacitance of the fourth capacitor in response to the frequency band to be received.

6. The RF receiver according to claim 5,
    wherein the fourth capacitor comprises a plurality of capacitors, and
    wherein the capacitance adjuster section is connected with at least one of the plurality of capacitors to switch the capacitance of the fourth capacitor.

7. The RF receiver according to claim 4,
    wherein the second capacitor includes a plurality of capacitors, and
    wherein the capacitance adjuster section is connected with at least one of the plurality of capacitors to switch a capacitance of the second capacitor.

8. The RF receiver according to claim 2, wherein the first variable capacitance diode, the second variable capacitance diode, and the third variable capacitance diode have capacitance-changing characteristics substantially equal to each other.

9. The RF receiver according to claim 8, wherein changing ratios of respective capacitances of the first to third variable capacitance diodes are substantially equal to a changing ratio of a capacitance corresponding to a widest frequency band of the first frequency band and the second frequency band.

10. The RF receiver according to claim 1,
wherein the second frequency band includes a VHF high band, and
wherein, when said RF receiver receives a signal in the VHF high band, a dividing rate of the frequency divider is determined to be ½, and the oscillation frequency of the local oscillator ranges from 360 MHz to 900 MHz.

11. The RF receiver according to claim 1,
wherein the second frequency band includes a VHF low band, and
wherein, when said RF receiver receives a signal in the VHF low band, a dividing rate of the frequency divider is determined to be ¼, and the oscillation frequency of the local oscillator ranges from 360 MHz to 900 MHz.

12. The RF receiver according to claim 1,
wherein the second frequency band includes a VHF low band, and
wherein, when said RF receiver receives a signal in the VHF low band, a dividing rate of the frequency divider is determined to be ⅕, and the oscillation frequency of the local oscillator ranges from 360 MHz to 900 MHz.

13. The RF receiver according to claim 1, wherein a signal output from the frequency divider is supplied to the PLL circuit when said RF receiver receives a signal in the second frequency band.

14. The RF receiver according to claim 1,
wherein the first mixer includes
a fifth mixer operable to mix the signal output from the first tuned filter with the first output signal of the frequency divider,
a second phase shifter operable to shift a signal output from the fifth mixer in phase by 90 degrees, and
a sixth mixer operable to mix the signal output from the first tuned filter with the second output signal of the frequency divider, and
wherein a signal output from the sixth mixer and a signal output from the second phase shifter are output from the output terminal.

15. The RF receiver according to claim 1, further comprising a switch connected with the frequency divider for switching a dividing ratio of the frequency divider in response to a frequency band to be received.

16. A radio-frequency (RF) receiver comprising:
an input terminal for receiving an RF signal in a first frequency band and an RF signal in the a second frequency band lower than the first frequency band;
a first tuned filter connected with the input terminal and allowing a signal of a passing frequency in the RF signal in the first frequency band to pass through the first tuned filter;
a local oscillator;
a frequency divider for frequency-dividing a signal output from the local oscillator;
a first mixer operable to mix a signal output from the first tuned filter with the signal output from the local oscillator to convert the signal output from the first tuned filter into a signal of an intermediate frequency;
a second tuned filter connected with the input terminal and allowing a signal of a passing frequency in the RF signal in the second frequency band to pass through the second tuned filter;
a second mixer operable to mix a signal output from the second tuned filter with a signal output from the frequency divider to convert the signal output from the second tuned filter into a signal of an intermediate frequency;
an output terminal for outputting the signals of the intermediate frequency from the first mixer and the second mixer; and
a phase-locked-loop (PLL) circuit operable to control an oscillation frequency of the local oscillator, the passing frequency of the first tuned filter, and the passing frequency of the second tuned filter,
wherein the signal output from the frequency divider contains at least three signals which are different in phase from each other and are generated by frequency-dividing the signal output from the local oscillator, and
wherein the second mixer comprises a harmonic rejection mixer including at least three mixers, said at least three mixers receiving said at least three signals generated by the frequency divider, respectively.

17. The RF receiver according to claim 16, wherein a dividing ratio of the frequency divider is not greater than ⅓.

18. The RF receiver according to claim 16, wherein the first frequency band of the radio-frequency signal is a UHF band, and the second frequency band is a VHF band.

19. The RF receiver according to claim 16, further comprising a switch connected with the frequency divider and for switching a dividing ratio of the frequency divider in response to a frequency band to be received.

20. A radio-frequency (RF) receiver comprising:
an input terminal for receiving an RF signal in a first frequency band and an RF signal in a second frequency band lower than the first frequency band;
a tuned filter connected with the input terminal and allowing the RF signals to pass through the tuned filter;
a local oscillator;
a frequency divider for frequency-dividing a signal output from the local oscillator;
a first mixer operable to mix the RF signal in the first frequency band output from the tuned filter with a signal output from the frequency divider to convert the RF signal in the first frequency band output from the tuned filter into a signal of an intermediate frequency;
a second mixer operable to mix the RF signal in the second frequency band output from the tuned filter with the signal output from the frequency divider to convert the RF signal in the second frequency band output from the tuned filter into a signal of the intermediate frequency;
an output terminal for outputting the signals of the intermediate frequency output from the first mixer and the second mixer;
a phase-locked-loop (PLL) circuit operable to control an oscillation frequency of the local oscillator and a passing frequency of the tuned filter; and
a switch for switching a dividing ratio of the frequency divider in response to a frequency band to be received,
wherein the signal output from the frequency divider contains a first output signal and a second output signal different in phase by 90 degrees from the first output signal, the first and second output signal being produced by frequency dividing the signal output from the local oscillator,
wherein the first mixer includes
a third mixer operable to mix the RF signal in the first frequency band output from the tuned filter with the first output signal of the frequency divider,
a first phase shifter for shifting a signal output from of the third mixer in phase by 90 degrees, and a fourth mixer operable to mix the RF signal in the first frequency band output from the tuned filter with the second output signal of the frequency divider, wherein the second mixer includes
a fifth mixer operable to mix the RF signal in the second frequency band output from the tuned filter and the first output signal of the frequency divider,
a second phase shifter for shifting a signal output from of the fifth mixer in phase by 90 degrees, and
a sixth mixer operable to mix the RF signal in the second frequency band output from the tuned filter with the second output signal of the frequency divider, and wherein signals output from the fourth mixer, the first phase shifter, the sixth mixer, and the second mixer are output from the output terminal.

21. The RF receiver according to claim 20,
wherein the first frequency band and second frequency band comprise a VHF high band and a VHF low band, respectively,
wherein the oscillating frequency of the local oscillator ranges from 360 MHz to 900 MHz, and
wherein the switch is operable to determine the dividing ratio of the frequency divider to be ½ when said RF receiver receives the RF signal in the first frequency band, and to be ¼ when said RF receiver receives the RF signal in the second frequency band.

22. The RF receiver according to claim 20,
wherein the frequency divider includes:
a first fixed frequency divider for frequency-dividing a frequency of the signal output from the local oscillator into ½; and
a second fixed frequency divider connected in series with the first fixed frequency divider, and
wherein the switch is operable to supply a signal output from the first fixed frequency divider selectively to one of the second fixed frequency divider and the first mixer.

23. A radio-frequency (RF) receiver comprising:
an input terminal for receiving an RF signal in a first frequency band and an RF signal in a second frequency band lower than the first frequency band;
a first tuned filter connected with the input terminal and allowing a signal of a passing frequency in the RF signal in the first frequency band to pass through the first tuned filter;
a local oscillator;
a frequency divider for frequency dividing a signal output from the local oscillator;
a first mixer for mixing a signal output from the first tuned filter with the signal output from the local oscillator to convert the signal output from the first tuned filter into a signal of an intermediate frequency;
a second tuned filter connected with the input terminal and allowing a signal of a passing frequency in the RF signal in the second frequency band to pass through the second tuned filter;
a second mixer for mixing a signal output from the second tuned filter with the signal output from the frequency divider to convert the signal output from the second tuned filter into a signal of the intermediate frequency;
an output terminal for outputting the signals of the intermediate frequency output from the first mixer and the second mixer; and a phase-locked-loop (PLL) circuit operable to control an oscillation frequency of the local oscillator and the passing frequencies of the first tuned filter and the second tuned filter,
wherein the first mixer comprises an image rejection mixer including a phase shifter and two mixers, and
wherein the second mixer comprises a harmonic rejection mixer including a phase shifter and at least three mixers.

24. The RF receiver according to claim 23, wherein the second frequency band is a VHF low band.

25. The RF receiver according to claim 24, wherein a dividing rate of the frequency divider is not greater than ⅓.

26. An integrated circuit adapted to be used in a radio-frequency (RF) receiver for receiving an RF signal in a first frequency band and an RF signal in a second frequency band lower than the first frequency band, said integrated circuit comprising:
a package;
a local oscillator accommodated in the package;
a frequency divider accommodated in the package, for frequency-dividing a signal output from the local oscillator;
a first mixer accommodated in the package and being operable to mix a signal in the first frequency band with the signal output from the local oscillator to convert the signal in the first frequency band into a signal of an intermediate frequency;
a second mixer accommodated in the package and being operable to mix a signal in the second frequency band with the signal output from the frequency divider to convert the signal in the second frequency band into a signal of the intermediate frequency,
an output terminal for outputting the signals of the intermediate frequency output from the first mixer and the second mixer, and
a phase-locked-loop (PLL) circuit accommodated in the package and being operable to control an oscillation frequency of the local oscillator,
wherein the signal output from the frequency divider contains a first output signal and a second output signal different in phase by 90 degrees from the first output signal, the first and second output signals being produced by frequency-dividing the signal output from the local oscillator,
wherein the second mixer includes
a third mixer operable to mix a signal output from a tuned filter with the first output signal of the frequency divider,
a first phase shifter for shifting a signal output from the third mixer I phase by 90 degrees, and
a fourth mixer operable to mix the signal output from the tuned filter with the second output signal of the frequency divider, and
wherein signals output from the fourth mixer and the first phase shifter are output from the output terminal.

27. The integrated circuit according to claim 26,
wherein the local oscillator includes
an oscillator section for generating the signal output from the local oscillator, and
an oscillation frequency adjuster section operable to change an oscillation frequency of the signal generated by the oscillator section,
a series assembly connected with the oscillator, the series assembly including a first variable capacitance diode and a first capacitor connected in series with each other, and an inductor connected in parallel with the series assembly.

28. The integrated circuit according to claim 27,
wherein the oscillating frequency adjuster section includes a second capacitor connected in parallel with the first variable capacitance diode, and
wherein said local oscillator further includes a capacitance adjuster section operable to change capacitances of the first capacitor and the second capacitor according to a frequency band to be received.

29. The integrated circuit according to claim 28,
wherein the first capacitor comprises a third capacitor and a fourth capacitor connected in parallel with the third capacitor,
wherein the capacitance adjuster section is operable to switch between the third capacitor and the fourth capacitor according to a frequency band to be received, and
wherein the capacitor adjuster section includes
  a first port and a second port connected with both ends of the inductor, respectively,
  a third port located between the first port and the second port and connected with the second capacitor, and
  a fourth port located between the first port and the second port and connected with the fourth capacitor.

30. An integrated circuit adapted to be used in a radio-frequency (RF) receiver for receiving an RF signal in a first frequency band and an RF signal in a second frequency band lower than the first frequency band, said integrated circuit comprising:

a package;
a local oscillator accommodated in the package;
a frequency divider accommodated in the package, for frequency-dividing a signal output from the local oscillator;
a first mixer accommodated in the package and being operable to mix a signal in the first frequency band with the signal output from the local oscillator to convert the signal in the first frequency band into a signal of an intermediate frequency;
a second mixer accommodated in the package and being operable to mix a signal in the second frequency band with a signal output from the frequency divider to convert the signal in the second frequency band into a signal of the intermediate frequency;
an output terminal for output the signals of the intermediate frequency from the first mixer and the second mixer; and
a phase-locked-loop (PLL) circuit accommodated in the package and being operable to control an oscillation frequency of the local oscillator;
wherein the first mixer comprises an image rejection mixer including a phase shifter and a plurality of mixers, and
wherein the second mixer comprises a harmonic rejection mixer including at least two phase shifter and at least three mixers.

\* \* \* \* \*